US007060520B2

(12) United States Patent
Kawauchi et al.

(10) Patent No.: US 7,060,520 B2
(45) Date of Patent: Jun. 13, 2006

(54) PIEZOELECTRIC DEVICE AND COVER SEALING METHOD AND APPARATUS THEREFOR, CELLULAR PHONE APPARATUS USING PIEZOELECTRIC DEVICE AND ELECTRONIC APPARATUS USING PIEZOELECTRIC DEVICE

(75) Inventors: Osamu Kawauchi, Shiojiri (JP); Kenji Sakurai, Iida (JP); Kenichiro Murata, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 71 days.

(21) Appl. No.: 10/382,840

(22) Filed: Mar. 7, 2003

(65) Prior Publication Data
US 2004/0104643 A1 Jun. 3, 2004

(30) Foreign Application Priority Data
Mar. 25, 2002 (JP) ............................. 2002-084332
Mar. 4, 2003 (JP) ............................. 2003-057506

(51) Int. Cl.
*H01L 21/00* (2006.01)
*H01L 21/48* (2006.01)
(52) U.S. Cl. ...................... 438/51; 438/118; 438/125
(58) Field of Classification Search .................. 438/51, 438/66, 118, 125; 219/388, 405, 411; 264/493, 264/494
See application file for complete search history.

(56) References Cited

U.S. PATENT DOCUMENTS

| 4,524,238 | A | * | 6/1985 | Butt | ............................ 174/52.4 |
| 4,845,055 | A | * | 7/1989 | Ogata | ............................ 438/308 |
| 5,830,403 | A | * | 11/1998 | Fierkens | ................ 264/272.13 |
| 5,846,476 | A | * | 12/1998 | Hwang et al. | ............... 264/493 |
| 5,919,571 | A | * | 7/1999 | Badding et al. | ............. 428/432 |
| 5,921,461 | A | * | 7/1999 | Kennedy et al. | .......... 228/124.6 |
| 5,938,839 | A | * | 8/1999 | Zhang | ......................... 117/104 |
| 6,060,340 | A | * | 5/2000 | Chou | ........................... 438/110 |
| 6,206,997 | B1 | * | 3/2001 | Egitto et al. | ................. 156/242 |
| 6,303,907 | B1 | * | 10/2001 | Hwang et al. | ............... 219/405 |
| 6,383,953 | B1 | * | 5/2002 | Hwang | ......................... 438/788 |
| 6,426,277 | B1 | * | 7/2002 | Bae et al. | .................... 438/522 |
| 2001/0027969 | A1 | * | 10/2001 | Takahashi et al. | ........... 219/390 |
| 2002/0061631 | A1 | * | 5/2002 | Miyabayashi et al. | ....... 438/478 |

FOREIGN PATENT DOCUMENTS
JP A-878955 3/1996

* cited by examiner

*Primary Examiner*—Michael Lebentritt
*Assistant Examiner*—Ron Pompey
(74) *Attorney, Agent, or Firm*—Oliff & Berridge, PLC

(57) ABSTRACT

The invention provides a method of sealing piezoelectric devices with covers capable of rapidly and securely sealing a plurality of packages or many packages of piezoelectric devices with covers. A piezoelectric device includes a package in which a piezoelectric vibrating reed is partially supported and fixed, and a cover fixed to the packages. In a method of sealing the packages with the covers, a plurality of the packages are arranged with the bottoms facing halogen lamps, so that the bottoms are irradiated with the light beams from the halogen lamps to thermally melt a brazing material disposed between the packages and the covers.

14 Claims, 25 Drawing Sheets

(P: P$^{5+}$ NETWORK FORMING ION)

(a)

(b)

PIEZOELECTRIC DEVICE AND COVER SEALING METHOD AND APPARATUS THEREFOR, CELLULAR PHONE APPARATUS USING PIEZOELECTRIC DEVICE AND ELECTRONIC APPARATUS USING PIEZOELECTRIC DEVICE

BACKGROUND OF THE INVENTION

1. Field of Invention

The present invention relates to a piezoelectric device including a piezoelectric vibrating reed contained in a package, and to an enhancement in a method of sealing the packages.

2. Description of Related Art

Small information apparatuses, such as HDDs (hard disk drives), mobile computers, and IC cards, and electronic apparatuses, such as cellular phones and the like, use a piezoelectric device, such as a piezoelectric vibrator, a piezoelectric oscillator, or the like, which includes a piezoelectric vibrating reed contained and sealed in a package.

Such a piezoelectric device is formed by setting a piezoelectric vibrating reed in a ceramic package having the open top, and fixing a cover to the package to seal the package.

The piezoelectric device is manufactured as schematically shown in a flow chart of FIG. 28.

First, a box-like package including a piezoelectric material, such as ceramic or the like, is prepared, and a piezoelectric vibrating reed including a piezoelectric material, such as quartz or the like, is fixed to an electrode, which is previously formed in the package, with a conductive adhesive (ST1).

Next, the package is sealed with a cover using a brazing material (hereinafter "cover sealing") (ST2). Then, the package is annealed by external heating to discharge, for example, harmful gas components produced from the conductive adhesive used to fix the piezoelectric vibrating reed (ST3).

Furthermore, the annealed package is placed in vacuum to remove the gas components to the vacuum from a through hole previously formed in the package, and then the through hole is filled with a metal material under heating to seal the through hole in vacuum (hereinafter "hole sealing") (ST4).

Finally, a laser beam is transmitted through the cover from the outside to irradiate the electrode of the piezoelectric vibrating reed contained in the package, to partially evaporate the electrode. In this way, the frequency is controlled in a mass reduction system to control the vibration frequency (ST5), and then necessary inspections are performed to complete the piezoelectric device.

In the step ST2, the package is sealed with the cover by using, for example, such a belt furnace-type sealing apparatus 1 as shown in FIGS. 29(*a*) and 29(*b*). FIG. 29(*a*) is a schematic plan view of the sealing apparatus 1, and FIG. 29(*b*) is a schematic side view of the sealing apparatus 1.

The sealing apparatus 1 includes a heating chamber 2 in which a belt 4 including a conveyor belt is moved. Also, a plurality of heaters 3 is disposed along the movement direction of the belt 4 in the heating chamber 2. Furthermore, a package 6 is placed on the belt 4 and moved by the belt 4 along the direction of an arrow A. In the heating chamber 2, the package 6 is heated by the heaters 3 provided above the belt 4 during movement.

As shown in an enlarged view of FIG. 30, the package 6 is arranged on the belt 4 with the bottom facing upward and a cover 7 facing downward. On the open side of the package 6, a brazing material 8 including lead-containing low-melting-point glass, Au/Sn, or the like is disposed between the package 6 and the cover 7. This structure is disclosed in columns 0003 and 0011 of Japanese Unexamined Patent Application Publication No. 8-78955, for example.

A piezoelectric vibrating reed 6*a* is contained in the inner space S of the package 6. As described above with respect to ST1 shown in FIG. 28, the piezoelectric vibrating reed 6*a* is fixed to the inner bottom of the package 6 with a conductive adhesive 6*b* including a silver paste or the like.

In this state, a tray 3 and the package 6 are moved in the direction shown by arrow A in FIGS. 29(*a*) and 29(*b*) so that the package 6 is sealed with the cover 7 during the passage through the heating chamber 2.

Namely, as shown in FIGS. 29(*a*) and 29(*b*), the tray 3 and the package 6 are moved in the direction shown by arrow A in FIGS. 29(*a*) and 29(*b*), and the brazing material 8 between the package 6 and the cover 7 is melted during the passage through the heating chamber 2 to seal the package 6 with the cover 7.

SUMMARY OF THE INVENTION

However, in the sealing apparatus 1 shown in FIGS. 29(*a*) and 29(*b*), the ambient temperature of the package 6 moved in the heating chamber 2 varies with the passage of time according to the temperature profile shown in FIG. 31.

Namely, as shown in FIG. 31, in a heating step using the sealing apparatus 1, the time T1 required to increase the temperature to about 320° C. at which melting of the brazing material 8 is started is about 15 minutes, and the melting time T2 of the brazing material 8 required to further increase the temperature to 360° C. and then lower the temperature to 320° C. is about 30 minutes. Furthermore, the time T3 required to lower the temperature of 320° C. to about room temperature is about 15 minutes.

In this way, a long time is required to seal the package 6 with the cover 7, and thus the inside of the package 6 is exposed to a high temperature for a long time. Therefore, for example, the silver paste 6*b* used to support the piezoelectric vibrating reed 6*a* deteriorates.

Also, the heating device 4 must be operated for a long time to increase the required driving energy. Particularly, the sealing apparatus 1 including the belt furnace requires a long standing time, and thus much time is required to start the sealing apparatus 1 when the temperature decreases at a break of production. Therefore, heating must be continued even at a break of production, and nitrogen also must be continuously introduced. Furthermore, the heaters 3 must be heated to about 600° C. to heat the brazing material 8 to 360° C. Therefore, the sealing method is very wasteful.

When a lead-free brazing material is used as the brazing material 8 to seal the package 6 with the cover 7, the brazing material cannot be melted at the temperature of about 320° C., and a high temperature of 430° C. or more is required. Such a high temperature causes the need for a longer time and an energy waste. Therefore, the related art sealing apparatus 1 cannot be adapted to the lead-free brazing material.

FIG. 32 shows a conceivable method.

In FIG. 32, a tray 3*a* is supported by a supporting device in a chamber 2, and a plurality of packages 6 are placed on the tray 3*a*, as shown in an enlarged view in an upper portion of FIG. 32.

Also, a cover 7 including a light transmitting material, such as glass or the like, is irradiated from above with a laser beam L1 from a laser beam irradiation device 9 so that the laser beam L1 is applied to a position corresponding to a brazing material 8 to thermally melt the brazing material 8 by the laser beam L1, thereby fixing the cover 7 to the upper end of each package 6 and sealing each package 6.

However, in this method, the laser beam L1 must be scanned along a sealing margin of the cover 7 to be overlapped with the top of the package 6 to cause complexity in scanning the laser beam L1 on each of the packages 6. There is thus the problem of requiring a long time to seal each of all packages 6 arranged on the tray 3a with the cover 7. Therefore, the method is disadvantageous in that it is not suitable for a batch process of simultaneously sealing many packages 6.

The present invention provides a method and apparatus for sealing packages of piezoelectric devices with covers capable of securely and rapidly sealing a plurality of packages or many packages of piezoelectric devices with covers, each of the piezoelectric devices having a hole sealed by the sealing method, a cellular phone apparatus using the piezoelectric device, and an electronic apparatus using the piezoelectric device.

In a first aspect of the present invention, a method of sealing packages of piezoelectric devices with covers is provided, each piezoelectric device including the package in which a piezoelectric vibrating reed is partially supported and fixed, and the cover fixed to the package. The method includes: arranging the plurality of packages the bottoms of which face halogen lamps, and irradiating the plurality of packages with light beams from the halogen lamps so that the bottoms are irradiated with the light beams to thermally melt a brazing material disposed between each of the packages and the cover.

In the construction of the first aspect of the present invention, the light beams from the halogen lamps are used to permit light beam irradiation within a predetermined range. Therefore, an effective heating range can be extended, and thus a plurality of packages can be sealed with the covers by simultaneously heating the bottoms of the packages, as compared with a focused narrow light beam such as a laser beam. Furthermore, the time required to heat to a temperature necessary for sealing is short to shorten a total heating time, as compared with the use of a belt furnace having a heating means comprising a heating wire. Therefore, the structure in each of the packages is less adversely affected by heat.

Also, even when a lead-free high-melting-point brazing material is used to fix the covers, the brazing material can be heated to a melting temperature within a short time.

The cover of each of the packages may be made of a light-transmitting material.

The cover sealing method is performed in a step of the above-described process for manufacturing a piezoelectric device, and thus the present invention can be used for a method of manufacturing a piezoelectric device including a cover sealing method.

Thus, the present invention can provide a method of sealing piezoelectric devices with covers, capable of rapidly and securely sealing a plurality of packages or many packages of piezoelectric devices with covers.

In a second aspect of the present invention, the construction of the first aspect of the present invention is provided such that the packages are arranged on a holding device, with the bottoms facing outward before irradiation of the light beams from the halogen lamps.

In the construction of the second aspect of the present invention, a plurality of packages are appropriately positioned and held so that portions to be irradiated with the light beams from the halogen lamps face outward.

In a third aspect of the present invention, the construction of the first or second aspect of the present invention is provided such that a cover including a glass material is used as each of the covers, and low-melting-point glass is used as the brazing material.

In the construction of the third aspect of the present invention, lead-free low-melting-point glass is used as the brazing material to fix the covers to realize lead-free processing.

In a fourth aspect of the present invention, the construction of any one of the first to third aspects of the present invention is provided such that the light beams are emitted in substantially parallel from the halogen lamps of a lamp unit to simultaneously irradiate a region including all of the plurality of packages with the light beams.

In the construction of the fourth aspect of the present invention, many light source lamps are used according to demand so that many packages to be treated at a time can be arranged with equal intervals corresponding to the halogen lamps to permit a batch process.

In a fifth aspect of the present invention, the construction of any one of the second to fourth aspects of the present invention is provided such that a mask is disposed to cover only the packages and partially expose the holding device, and then irradiation of the light beams from the halogen lamps is performed.

In the construction of the fifth aspect of the present invention, the packages are covered with the mask to reduce or effectively prevent irradiation of the packages with the light beams from the halogen lamps, and the holding device not covered with the mask is heated to effectively melt the brazing material due to heat transfer from the holding device to the covers and the brazing material, thereby reducing or avoiding heat damage to the packages.

In a sixth aspect of the present invention, the construction of any one of the first to fifth aspects of the present invention is provided such that the plurality of packages are contained in an air-tight chamber, an inert gas is introduced into the chamber after the chamber is evacuated, and then irradiation of the light beams of the halogen lamps is performed.

In the construction of the sixth aspect of the present invention, the heat of the light beams of the halogen lamps can be transmitted through the inert gas, for example, nitrogen, to melt the brazing material, and reduce or effectively prevent oxidation deterioration of jigs, such as the holding device and the like provided in the chamber.

In a seventh aspect of the present invention, the construction of any one of the first to fifth aspects of the present invention is provided such that a brazing material having bonds of oxygen and metal atoms is used as the brazing material, and the brazing material is melted by irradiation of the light beams of the halogen lamps in the air.

In the construction of the seventh aspect of the present invention, a brazing material including a compound of oxygen and metal atoms is used as the brazing material, and the brazing material is melted by irradiation of the light beams of the halogen lamps in the air. Therefore, in melting the brazing material by irradiation of the light beams of the halogen lamps, oxygen omission causing deterioration in wettability of the brazing material is compensated for by atmospheric oxygen. As a result, the fluidity of the brazing material is enhanced to enhance the wettability and decrease the melting temperature, as compared with melting in a nitrogen atmosphere.

Also, even in irradiation of the light beams from the halogen lamps in the air, oxidation of filaments of the halogen lamps can be reduced or prevented because the filaments are contained in bulbs. Furthermore, the light beams of the halogen lamps directly heat an irradiation target to suppress the temperatures of members other than the irradiation target to a level lower than in related art methods, thereby effectively reducing or preventing, for example, oxidation of the chamber.

An eighth aspect of the present invention provides a method of manufacturing a piezoelectric device including a package having a through hole to communicate the outside to an internal space, which accommodates a piezoelectric vibrating reed, and a cover fixed to the package. The method includes: arranging a plurality of packages the bottoms of which face halogen lamps, irradiating the bottoms of the packages with light beams of the halogen lamps in the air to heat-melt a brazing material, which is disposed between each of the packages and the cover and which comprises a compound of oxygen and metal atoms, to seal each of the packages with the cover, evacuating the internal space of each of the packages through the through hole, and then filling the through holes with a sealing material in a vacuum atmosphere to seal the through holes.

In the eighth aspect of the present invention, the method of manufacturing the piezoelectric device including the cover fixed to the package including the piezoelectric vibrating reed contained therein includes: arranging a plurality of packages the bottoms of which face the halogen lamps, and irradiating the bottoms of the packages with the light beams from the halogen lamps to thermally melt the brazing material disposed between each of the packages and the cover, to seal each of the packages with the cover. Therefore, on the same principle as that of the first aspect of the present invention, the plurality of package can be sealed with the covers by simultaneously heating the bottoms of the packages.

Also, the brazing material including the compound of oxygen and metal atoms is melted by irradiation of the light beams of the halogen lamps in the air. Therefore, on the same principle as that of the seventh aspect of the present invention, the wettability of the brazing material can be enhanced to decrease the melting temperature, and oxidation of the filaments of the halogen lamps, the chamber, and the like can be reduced or effectively prevented.

Furthermore, after cover sealing, the internal space of each package is evacuated through the through hole, and the through holes are filled with the sealing material in a vacuum atmosphere to seal the through holes. As described above, therefore, even when the brazing material is melted in the air, harmful gases generated by melting the brazing material can be discharged from the internal spaces through the through holes, and then the through holes can be hermetically sealed to obtain a high-performance piezoelectric device.

In a ninth aspect of the present invention, the construction of the eighth aspect of the present invention is provided such that in the step of sealing the through hole, the sealing material before melting is disposed in the through holes, and then thermally melted by irradiation of the light beams from the halogen lamps to seal the holes.

In the construction of the ninth aspect of the present invention, in the step of sealing the through holes, the sealing material before melting is thermally melted by irradiation of the light beams from the halogen lamps. Therefore, a special electric source and another apparatus such as, for example, a laser generator and the like are not required to melt the sealing material, thereby permitting energy-saving hole sealing at low cost.

A tenth aspect of the present invention provides a method of sealing packages of piezoelectric devices with covers, each piezoelectric device including the package in which a piezoelectric vibrating reed is partially supported and fixed, and the cover fixed to the package. The method includes: arranging a plurality of packages with the covers disposed thereon and facing halogen lamps in a state in which a brazing material is interposed between the packages and the covers, and irradiating the covers of the packages with light beams from the halogen lamps to heat the covers, thermally melting the brazing material.

In the construction of the tenth aspect of the present invention, on the same principle as that of the first aspect of the present invention, a plurality of packages can be sealed with the covers by simultaneously heating the covers.

In an eleventh aspect of the present invention, the construction of the tenth aspect of the present invention is provided such that the packages are arranged on a holding device, with the covers facing outward before irradiation of the light beams from the halogen lamps.

In the construction of the eleventh aspect of the present invention, a plurality of packages are appropriately positioned and held so that positions to be irradiated with the light beams of the halogen lamps face outward.

In a twelfth aspect of the present invention, the construction of the tenth or eleventh aspect of the present invention is provided such that a cover including a glass material is used as each of the covers, and low-melting-point glass is used as the brazing material.

In a thirteenth aspect of the present invention, the construction of any one of the tenth to twelfth aspects of the present invention is provided such that the light beams are emitted in substantially parallel from the halogen lamps of a lamp unit to simultaneously irradiate an entire region including the plurality of packages with the light beams.

In a fourteenth aspect of the present invention, the construction of any one of the eleventh to thirteenth aspects of the present invention is provided such that a mask is disposed to cover at least a portion inside a cover sealing region of each of the packages and to partially expose the holding device, and then irradiation of the light beams of the halogen lamps is performed.

In the construction of the fourteenth aspect of the present invention, at least the portion inside the cover sealing region of each of the packages is covered with the mask to reduce or effectively prevent irradiation of the central portions of the covers with the light beams of the halogen lamps, and the holding device not covered with the mask is heated to effectively melt the brazing material due to heat transfer from the holding device to the covers and the brazing material, thereby reducing or avoiding as much heat damage to the packages as possible.

In a fifteenth aspect of the present invention, the construction of any one of the tenth to fourteenth aspects of the present invention is provided such that the plurality of packages are contained in an air-tight chamber, an inert gas is introduced into the chamber after the chamber is evacuated, and then irradiation of the light beams of the halogen lamps is performed.

In a sixteenth aspect of the present invention, the construction of any one of the tenth to fourteenth aspects of the present invention is provided such that a brazing material including a compound of oxygen and metal atoms is used as the brazing material, and the brazing material is melted by irradiation of the light beams of the halogen lamps.

In the construction of the sixteenth aspect of the present invention, on the same principle as the seventh aspect of the present invention, the wettability of the brazing material is enhanced to decrease the melting temperature, and oxidation of filaments of the halogen lamps and the chamber can be reduced or effectively prevented A seventeenth aspect of the present invention provides a method of manufacturing a piezoelectric device including a package having a through hole to communicate the outside to an internal space, which accommodates a piezoelectric vibrating reed, and a cover fixed to the package. The method includes: arranging a plurality of packages with the covers disposed thereon, and facing halogen lamps in a state where a brazing material is interposed between the packages and the covers, the brazing material including a compound of oxygen and metal atoms, heating the covers by irradiating the covers of the packages with light beams of the halogen lamps in the air to thermally melt the brazing material, to seal each of the packages with the cover, evacuating the internal space of each of the packages through the through hole, and then filling the through holes with a sealing material in a vacuum atmosphere to seal the through holes.

In the seventeenth aspect of the present invention, on the same principle as that of the tenth aspect of the present invention, the plurality of package can be sealed with the covers by simultaneously heating the covers of the packages. Also, on the same principle as that of the seventh aspect of the present invention, the wettability of the brazing material can be enhanced to decrease the melting temperature, and oxidation of the filaments of the halogen lamps, the chamber, and the like can be reduced or effectively prevented. Furthermore, on the same principle as the eighth aspect of the present invention, harmful gases generated by melting the brazing material can be discharged from the internal spaces through the through holes to obtain a high-performance piezoelectric device.

In an eighteenth aspect of the present invention, the construction of the seventeenth aspect of the present invention is provided such that in the step of sealing the through holes, the sealing material before melting is disposed in the through holes, and then thermally melted by irradiation of the light beams from the halogen lamps to seal the holes.

In the construction of the eighteenth aspect of the present invention, on the same principle as that of the ninth aspect of the present invention, energy-saving hole sealing can be performed at low cost.

A nineteenth aspect of the present invention provides an apparatus for sealing packages of piezoelectric devices with covers, each piezoelectric device including the package in which a piezoelectric vibrating reed is partially supported and fixed, and the cover fixed to the package. The apparatus includes a device to arrange and hold a plurality of packages with the bottoms or the covers facing lamps, a mask disposed outside the plurality of packages so as to expose at least the holding device to hold the plurality of packages, and a lamp unit for irradiation of light beams from halogen lamps from above the mask.

In the construction of the nineteenth aspect of the present invention, the lamp unit for irradiation of the light beams from the halogen lamps uses the halogen lamps as light sources to permit heating to a relatively high sealing temperature within a short time. Also, unlike a laser beam or the like, a light beam for heating can be applied in a wide range. Therefore, when a plurality of package or many packages are arranged by the holding device, the packages can be heated within a wide range. Furthermore, the mask is provided outside the plurality of packages so as to expose at least the holding device to hold the plurality of packages, thereby reducing or avoiding direct irradiation of the packages with the light beams from the halogen lamps as much as possible to reduce or prevent the probability of damage to the packages.

In a twentieth aspect of the present invention, the construction of the nineteenth aspect of the present invention is provided such that a chamber is provided to hermetically hold the plurality of packages, and the lamp unit is contained in the chamber.

In the construction of the twentieth aspect of the present invention, the lamp unit is contained in the chamber, and thus all partition walls of the chamber can be made of a same metal to make it easy to maintain air-tight performance.

In a twenty-first aspect of the present invention, the construction of the nineteenth aspect of the present invention is provided such that a chamber is provided to hermetically hold the plurality of packages, the lamp unit is disposed outside the chamber, and the chamber has light-transmitting partition walls which transmit the light beams from the lamp unit.

In the construction of the twenty-first aspect of the present invention, even when the lamp unit is disposed outside the chamber, the inside of the chamber can be irradiated with the light beams of the halogen lamps through the light-transmitting partition walls. In this case, the lamp unit is provided outside the chamber, and thus a device to supply an electric current to the lamp unit and a device to control the lamp unit can be formed outside the chamber to simplify the configuration of the apparatus.

In a twenty-second aspect of the present invention, the construction of any one of the nineteenth to twenty-first aspects of the present invention is provided such that the lamp unit is provided to simultaneously irradiate an entire region including the packages arranged.

In the construction of the twenty-second aspect of the present invention, all packages arranged on the holding means can be simultaneously sealed with the covers to significantly enhance working efficiency.

In a twenty-third aspect of the present invention, the construction of any one of the nineteenth to twenty-second aspects of the present invention is provided such that a cooling device is provided in the chamber.

In the construction of the twenty-third aspect of the present invention, after irradiation of the light beams from the halogen lamps, the temperature of the chamber can be lowered by the function of the cooling device within a short time after sealing is completed, thereby shortening a cycle time.

In a twenty-fourth aspect of the present invention, the object is achieved by a piezoelectric device including a package in which the piezoelectric vibrating reed is partially supported and fixed, and a cover fixed to the package. A brazing material disposed between the package and the cover is thermally melted by a light beam from a halogen lamp to seal the package with the cover.

In the construction of the piezoelectric device of the twenty-fourth aspect of the present invention, in comparison to the use of a related art belt furnace including a heating device using an electric wire, a time required to heat to a temperature necessary to seal is short to shorten a total heating time, and an adverse effect of heat is not exerted on the internal structure of the package, thereby enhancing quality.

In a twenty-fifth aspect of the present invention, the construction of the twenty-fourth aspect of the present invention is provided such that the package has a through hole formed at the bottom, and the through hole is filled with a sealing material to seal the hole.

In the construction of the twenty-fifth aspect of the present invention, harmful gases generated from an adhesive used in the package due to the heat for sealing the package with the cover can be removed by evacuating the chamber from the through hole to remove an adverse effect of the thermal step, thereby obtaining a high-performance piezoelectric device.

In a twenty-sixth aspect of the present invention, the construction of the twenty-fifth aspect of the present invention is provided such that the through hole formed in the package includes a first inner through hole having a predetermined internal diameter, and a second outer through hole having a larger internal diameter than that of the first through hole and provided to continue from the first through hole.

In the construction of the twenty-sixth aspect of the present invention, the through hole includes the first and second through holes having different internal diameters so that in the sealing step, the sealing material can be inserted into the through hole from the outside and disposed in the stepped portion formed by a difference between the internal diameters of the first and second through holes, thereby facilitating the sealing work and reducing or preventing the sealing material from entering in the package.

In a twenty-seventh aspect of the present invention, the construction of the twenty-sixth aspect of the present invention is provided such that the second through hole is continued from the first through hole with the stepped portion therebetween, and a metal coating having high wettability with the sealing material is provided on the inner surfaces of the stepped portion and the first through hole.

In the construction of the twenty-seventh aspect of the present invention, the metal coating having high wettability with the sealing material is provided on the inner surfaces of the stepped portion and the first through hole, and thus the melted sealing material easily adheres to the inner surfaces of the stepped portion and the first through hole, thereby forming a structure capable of reducing or preventing the sealing material from further entering in the package.

A twenty-eighth aspect of the present invention provides a cellular phone apparatus including a piezoelectric device including a package in which a piezoelectric vibrating reed is partially supported and fixed, and a cover fixed to the package. A control clock signal is generated by the piezoelectric device comprising the cover which is fixed to the package by thermally melting a brazing material disposed therebetween by a light beam from a halogen lamp.

A twenty-ninth aspect of the present invention provides an electronic apparatus including a piezoelectric device including a package in which a piezoelectric vibrating reed is partially supported and fixed, and a cover fixed to the package. A control clock signal is generated by the piezoelectric device including the cover which is fixed to the package by thermally melting a brazing material disposed therebetween by a light beam from a halogen lamp.

DETAILED DESCRIPTION OF PREFERRED EMBODIMENTS

Figure 1:
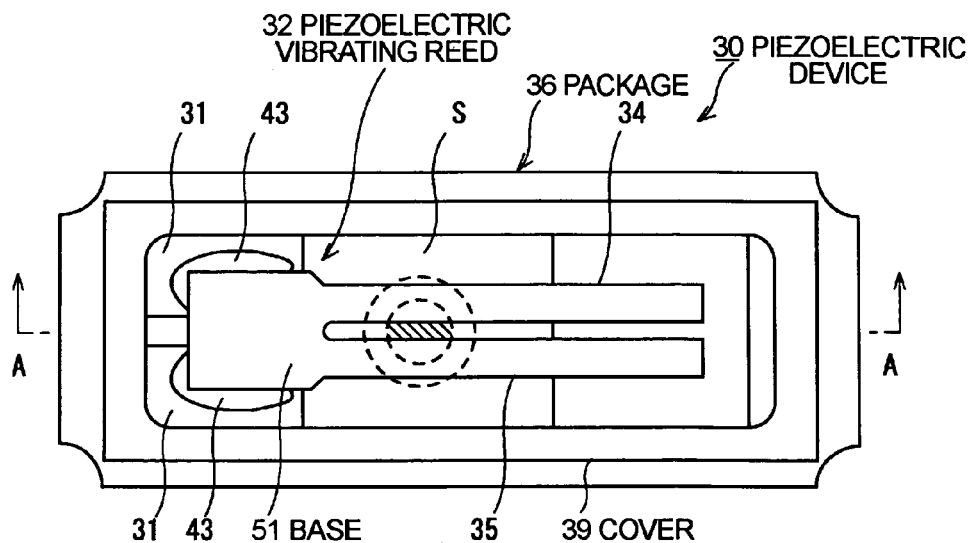
FIG. 1 is a schematic plan view showing a piezoelectric device according to a first exemplary embodiment of the present invention.

FIG. 1 shows a piezoelectric device according to a first exemplary embodiment of the present invention. FIG. 1 is a schematic plan view of the piezoelectric device, FIG. 2 is a schematic sectional view of the piezoelectric device taken along plane A—A in FIG. 1, and FIG. 3 is a bottom plan view of the piezoelectric device shown in FIG. 1.

In these drawings, a piezoelectric device 30 constitutes a piezoelectric vibrator as an example, and the piezoelectric device 30 includes a piezoelectric vibrating reed 32 contained in a package 36. The package 36 includes substrates composed of an aluminum oxide sintered material obtained by, for example, sintering a laminate of ceramic green sheets. Each of the substrates has a predetermined hole formed therein so that a predetermined internal space S is formed when the substrates are laminated.

Figure 2:
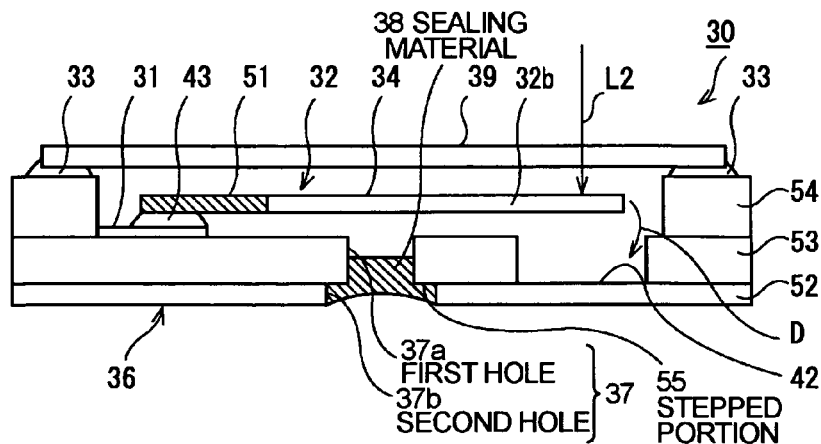
FIG. 2 is a schematic sectional view taken along plane A—A in FIG. 1.
Figure 3:
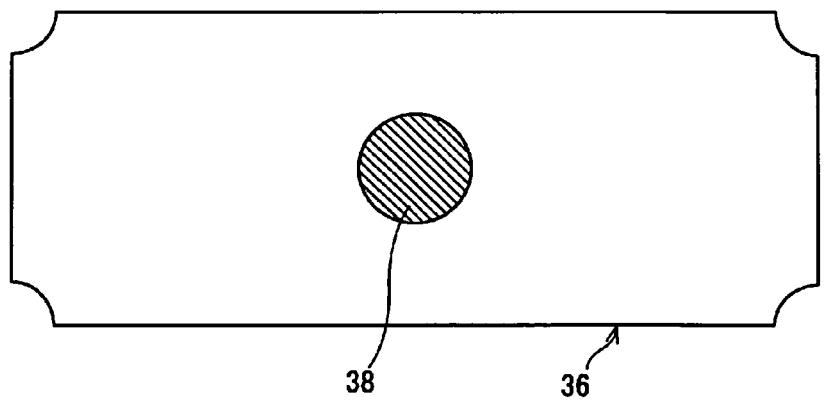
FIG. 3 is a bottom plan view of the piezoelectric device shown in FIG. 1.

Namely, as shown in FIG. 2, the package 36 of this exemplary embodiment includes, for example, a first laminated substrate 52, a second laminated substrate 53, and a third laminated substrate 54, which are provided in that order from below.

Also, electrodes 31 plated with Au and Ni are provided on the second laminated substrate 53 serving as a base for forming the inner bottom exposed in the internal space S of the package 36, as shown on the left side of the drawing. The electrodes 31 are connected to the outside, to supply a driving voltage. Furthermore, a conductive adhesive 43 is coated on each of the electrodes 31, the base end 51 of the piezoelectric vibrating reed 32 is mounted on the conductive adhesive 43, and then the conductive adhesive 43 is cured.

Furthermore, an extraction electrode (not shown) is formed on a portion of the base end 51 of the piezoelectric vibrating reed 32, which is in contact with the conductive adhesive 43, to transmit the driving voltage. Therefore, the piezoelectric vibrating reed 32 is electrically connected to a driving electrode through the electrodes 31 and the conductive adhesive 43 of the package 36.

The piezoelectric vibrating reed 32 includes, for example, quartz, and a piezoelectric material other than quartz, such as lithium tantalate, lithium niobate, or the like can also be used. In this exemplary embodiment, the piezoelectric vibrating reed 32 includes the base end 51 fixed to the package 36, and is forked in a pair of vibrating arms 34 and 35 which extend in parallel from the base end 51 to the right side of the drawing. Namely, a so-called tuning-fork type piezoelectric vibrating reed formed in a tuning fork-like shape as a whole is used.

Furthermore, a cover 39 is joined to the open upper end of the package 36 to seal the package 36 using preferably a lead-free brazing material, for example, a brazing material 33 including lead-free low-melting-point glass which has excellent bondability to the cover 39 including a glass material. The brazing material 33 may be previously disposed on the bonding end surface of the package 36 or on the bonding surface of the cover 39 before cover sealing. The cover sealing step is described in detail below. The cover 39 preferably includes a material having a linear thermal expansion coefficient close to that of the package 36, and a piezoelectric material or metal material satisfying this condition can be used. The cover 39 may include a light-transmitting material, for example, glass, for the frequency control described below.

In addition, the package 36 preferably has a through hole 37 which is formed near the center of the bottom by forming continuous through holes 37a and 37b in the two laminated substrates 52 and 53, respectively, which constitute the package 36. However, the through hole 37 may comprise a single hole. Of the two through holes 37a and 37b constituting the through hole 37, the outer second through hole 37b preferably has a larger internal diameter than that of the inner first hole 37a of the package, so that the through hole 37 has a stepped portion 55. A metal having high wettability with a metal selected as the sealing material described below, for example, a high-melting-point metal having a higher melting point than that of a lead-containing sealing material used as the sealing material, is preferably coated on the inner surfaces of the stepped portion of the second through hole 37b and the first through hole 37a. As the high-melting-point metal, for example, silver solder, Au/Sn, Au/Ge, and the like can be used. When any one of these metals is selected, gold is plated on a predetermined underlying layer.

Namely, the piezoelectric vibrating reed 32 is fixed in the package 36, and then the cover 39 is fixed to the package 36 in the step described below. Then, the through hole 37 is filled with a metal sealing material 38, preferably in a vacuum, to hermetically seal the package 36 (refer to FIG. 25). Therefore, even when harmful gases are thermally produced from the conductive adhesive 43 in the package 36 during cover sealing or annealing of the piezoelectric vibrating reed 32, the harmful gases can be removed through the through hole 37.

Then, a metal film (not shown) of the piezoelectric vibrating reed 32 is irradiated with a laser beam L2 from the outside through the transparent cover 39 to partially evaporate the metal film, whereby the frequency can be controlled in a mass reduction system.

Of the first and second holes 37a and 37b constituting the through hole 37, the outer second hole 37b of the package may be formed in a smaller internal diameter than that of the inner first hole 37a.

Furthermore, in this exemplary embodiment, the second laminated substrate 53 constituting the package 36 has a recess 42 formed by forming a hole near the right end to have a depth corresponding to the thickness of the second laminated substrate 53. The recess 42 is positioned below the free end 32b of the piezoelectric vibrating reed 32. In this exemplary embodiment, therefore, even when the free end 32b of the piezoelectric vibrating reed 32 is displaced in the direction of arrow D by an external impact applied to the package 36, the free end 32b is reduced or effectively prevented from contacting the inner bottom of the package 36.

Figure 4:
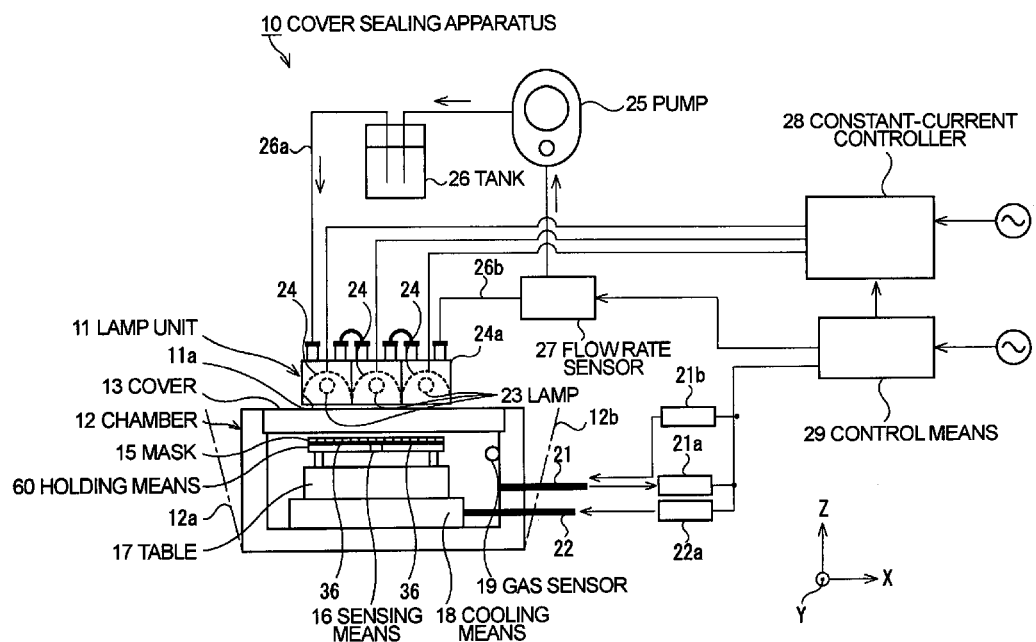
FIG. 4 is a schematic showing the entire construction of a cover sealing apparatus to seal the piezoelectric device shown in FIG. 1 with a cover according to an exemplary embodiment of the present invention.

FIG. 4 is a schematic showing the whole configuration of a cover sealing apparatus used to seal the hole of the piezoelectric device 30 according to the first exemplary embodiment.

In FIG. 4, a cover sealing apparatus 10 includes a chamber 12 which can be maintained in an air-tight state by closing doors 12a and 12b. The chamber 12 includes a device 60 provided therein to hold a plurality of the piezoelectric devices 30 or many piezoelectric devices 30 each of which includes the piezoelectric vibrating reed 32 supported and fixed in the inner space S of the package 36, and the cover 39 including a light-transmitting material, such as glass and disposed on the upper end of the package 36 through the brazing material 33, as described above with reference to FIGS. 1 to 3.

The device 60 to hold the packages 36 of the piezoelectric devices 30 is introduced into the chamber 12 through the carry-in door 12a in the sealing step, and then the device 60 is discharged from the carry-out door 12b after cover sealing.

As shown in FIG. 4, the holding device 60 is maintained at a predetermined height by a table 17 disposed on a cooling device 18 in the chamber 12. The holding device 60 includes a sensing device 16 including a temperature sensor which is composed of a thermocouple or the like to sense the ambient temperature of the plurality of packages 36 arranged on the holding device 60.

In the cooling device 18, for example, a coolant, such as cooing water or the like, is introduced from the outside, and circulated through necessary cooled portions in the chamber 12 to cool the inside of the chamber 12. For this purpose, a pipeline 22 connected to the cooling device 18 is extended to the outside so that the cooling water is supplied from an external cooling water supply device 22a. The cooling water supply device 22a is preferably connected to the control device 29 described below.

Also, a gas sensor 19 including a pressure sensor, an oxygen sensor, or the like is provided in the chamber 12, for sensing the gas pressure or gas concentration in the chamber 12. Furthermore, a pipeline 21 is extended outward from the chamber 12, and connected to an evacuation device 21a, such as a vacuum pump, and to a nitrogen supply device 21b to supply an inert gas, for example, nitrogen. The evacuation device 21a and the nitrogen supply device 21b are preferably connected to the control device 29 described below, and the control device 29 is preferably connected to the gas sensor 19. Therefore, during evacuation of the chamber 12, the gas pressure or gas concentration in the chamber 12 can be monitored.

Furthermore, the mask 15 described below is provided in the chamber 12 so as to entirely cover the plurality of packages 36 placed on the holding device 60. The mask 15 is not necessarily used depending upon the cover sealing step, as described below. As the mask 15, any one of plural types of masks can be used, as described below.

Also, a cover 13 is disposed near the upper surface of the mask 15 apart from the packages 36, e.g., disposed above the mask 15 shown in FIG. 4, so as to cover the top of the chamber 12. The cover 13 includes a light-transmitting material, such as glass or the like.

Furthermore, a lamp unit 11 is disposed outside the chamber 12 to be positioned above the cover 13 corresponding to the mask 15.

The lamp unit 11 includes a plurality of halogen lamps 23 as light sources which are provided in a casing 24a and serve as heat sources, reflectors 24 disposed as reflection planes for the respective halogen lamps 23 to be positioned on the surface of the lamp unit 11 apart from the packages 36 arranged in the chamber 12, which are irradiated with light beams of the halogen lamps 23, and a driving unit (not shown) for the halogen lamps 23.

The lamp unit 11 contains a necessary number of the halogen lamps 23 to obtain a sufficient quantity of heat. For irradiation of the light beams from the lamp unit 11, an opening 11a is preferably formed to be larger than a region necessary to cover all packages 36 placed on the holding device 60 in the chamber 12, as shown in FIG. 4.

Each of the reflectors 24 of the lamp unit 11 is a reflection device including a concave mirror surface, to reflect a part of light beam emitted from each of the halogen lamps 23 and outgoing to the side opposite to each package 36 so that the packages 36 are irradiated with the substantially parallel light beams through the opening 11a.

In this exemplary embodiment, the area of the opening 11a of the lamp unit 11 is preferably substantially the same as or larger than a region including all packages 36 arranged on the holding device 60 as described below. Consequently, all packages 36 as work pieces set on the holding device 60 can be simultaneously irradiated with the substantially parallel light beams of the halogen lamps through the opening 11a.

Figure 5:
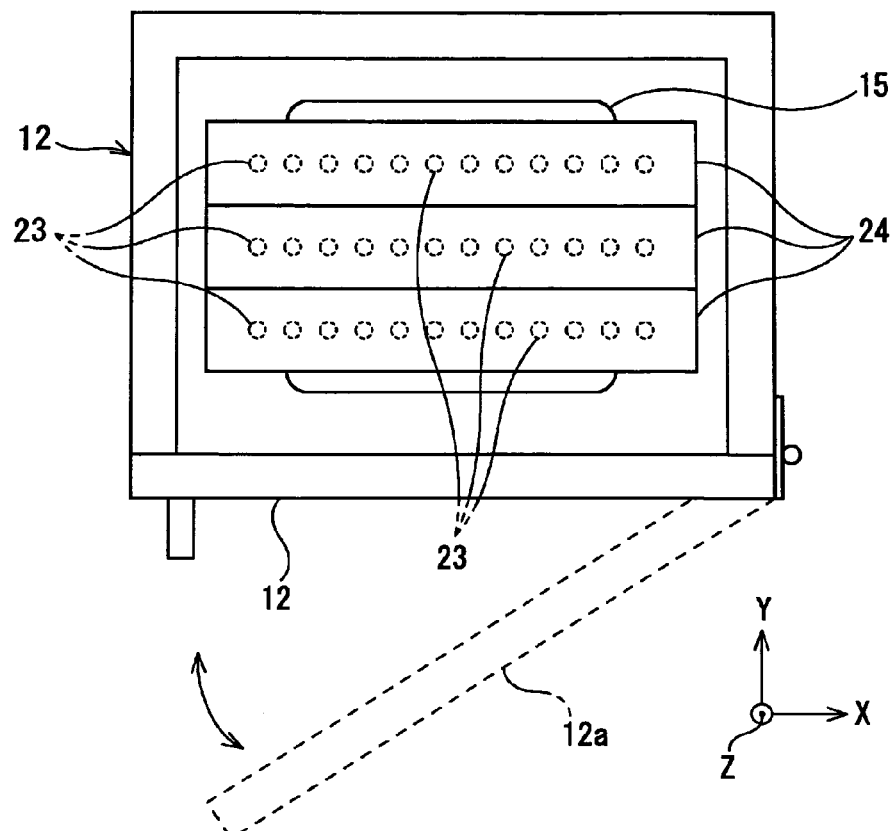
FIG. 5 is a schematic plan view showing the top of a chamber of the cover sealing apparatus shown in FIG. 4.

Furthermore, as shown in FIG. 5, the lamp unit 11 includes a plurality of reflectors 24 elongated in a direction, for example, three reflectors 24, which are arranged adjacent to each other along the longitudinal direction, and a plurality of halogen lamps 23 are arranged in the longitudinal direction along the center of each reflector 24.

The three reflectors 24 may be combined, or a unit including the three reflectors 23 may be used.

Each of the halogen lamps 23 includes a tungsten filament provided in a bulb in which a halogen gas is charged. When the tungsten filament is heated by electric current, the tungsten filament reacts with the halogen gas to produce a tungsten-halogen compound. The tungsten-halogen compound is carried to a portion near the filament by convection in the bulb, and is decomposed into tungsten and halogen gas due to high temperature to precipitate tungsten on the filament. This halogen cycle is repeated to emit a light beam.

In this case, the filament thickness of each halogen lamp 23, and the amount of the halogen gas contained in the bulb are controlled to achieve durability for a long time and a necessary amount of heat.

Figure 7:
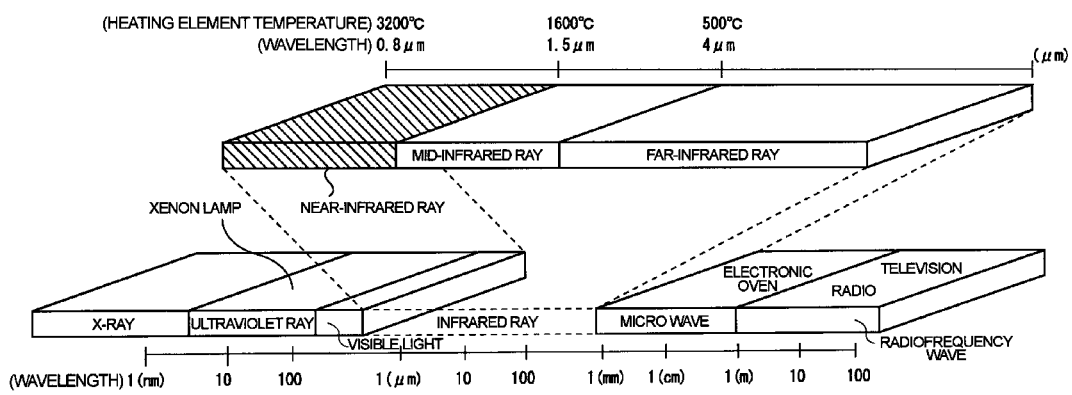
FIG. 7 is a schematic showing the wavelength region and temperature region of a halogen lamp used in the cover sealing apparatus shown in FIG. 4.

FIG. 7 shows the exothermic temperature and the wavelength region of the light beam of each halogen lamp 23 in this exemplary embodiment. In this exemplary embodiment, each of the halogen lamps 23 emits a light beam in the near-infrared region belonging to the exothermic temperature and wavelength region shadowed in FIG. 7.

In FIG. 4, a constant-current controller 28 is connected to the lamp unit 11 of the cover sealing apparatus 10. An AC power supply is connected to the constant-current controller 28. As the AC power supply, a home AC power supply of 100 V (volt) is used. The constant-current controller 28 has the function to control a driving current supplied from the AC power supply by AC-DC conversion of the voltage so that the driving current is stably applied to the lamp unit 11 at a constant voltage to reduce or prevent a variation in quantity of heat, and preferably a control function and a disconnection detecting function necessary to start the lamp unit 11.

Furthermore, a pump 25 and a flow rate sensor 27 are connected to the lamp unit 11 to form a circulation pipeline which is connected to the lamp unit 11 through a tank 26. Specifically, the circulation pipeline includes a supply pipe 26a extending from the cooling water tank 26 and connected to the lamp unit 11, and a return pine 26b extending from a pipeline extending at the back of the reflectors 24 to the tank 26 through the flow rate sensor 27 and the pump 25.

The flow rate sensor 27 provided in the circulation pipeline is connected to the control device 29. The control device 29 is connected to the constant-current controller 28. The control device 29 gives the constant-current controller 28 instructions to stepwisely change the quantity of heat of the lamp unit 11 and set the operating time according to the quantity of heat.

Also, the pump 15 and the flow rate sensor 27 are connected to the control device 29. The control device 29 has the function to control of a drive of the lamp unit 11 through the constant-current controller 28, and the function to drive the pump 25 to circulate the necessary cooling water through the lamp unit 11 while monitoring a signal output from the flow rate sensor 27, to reduce or prevent heating of the lamp unit 11.

The control device 29 may be connected to the sensing device 16 and the gas sensor 19 described above with reference to FIG. 4, and connected to the evacuation device 21a connected to the pipeline 21 and the external cooling water supply device 22a connected to the pipeline 22 so as to control the whole system.

In this way, the control device 29 is provided to control the whole cover sealing apparatus 10 or the lamp unit 11 serving as the light source or heat source, which constitutes whole or a part of the cover sealing apparatus 10, and the driving device for the lamp unit 11. Therefore, a controller containing an exclusive circuit or computer to exert a specially prepared sequence or software can be used, or a general-purpose small computer, such as a personal computer or the like, which contains a software to operate the cover sealing apparatus 10, may be used.

Figure 8:
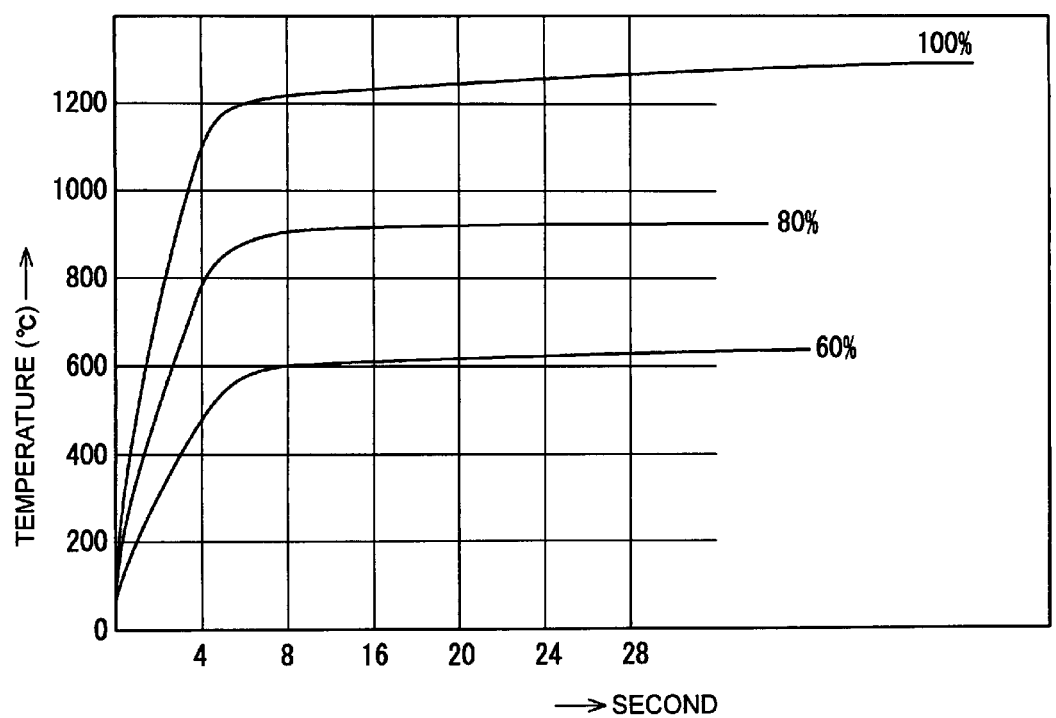
FIG. 8 is a graph showing the rising time and temperature of an operation of a halogen lamp used in the cover sealing apparatus shown in FIG. 4.

FIG. 8 shows an example of starting of the lamp unit 11. FIG. 8 shows the ultimate temperature and necessary time from power activation based on the output set to each of 60%, 80%, and 100% by instructions from the control device 29.

Figure 6:
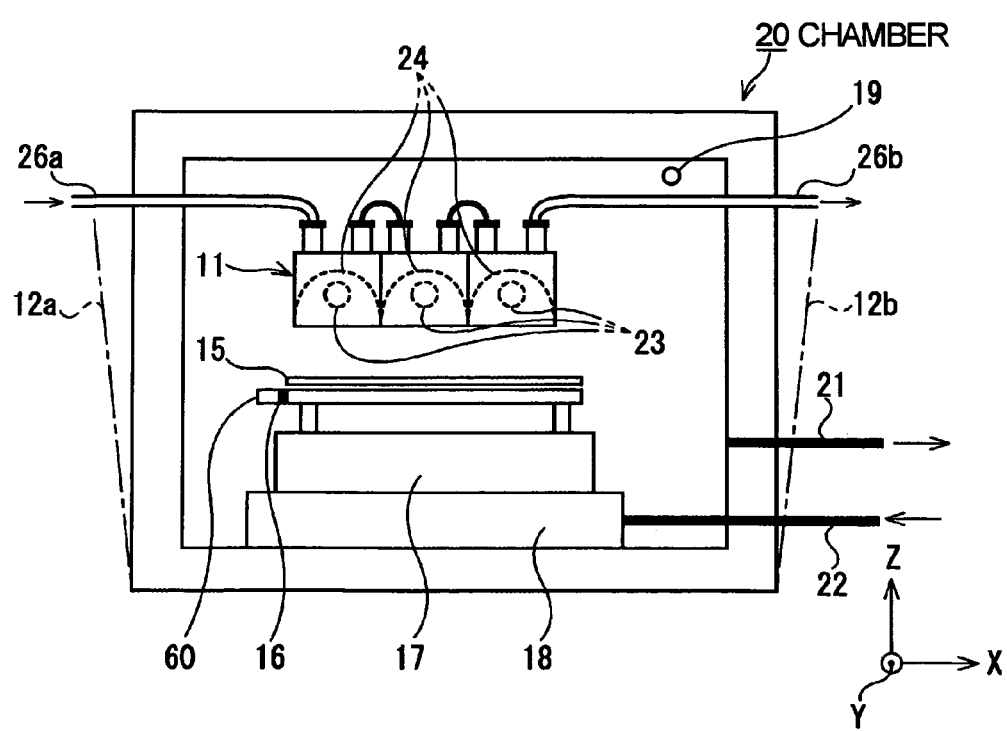
FIG. 6 is a schematic showing the construction of a significant portion of a modified example of the cover sealing apparatus shown in FIG. 4.

FIG. 6 shows a chamber 12 of a modified example of the cover sealing apparatus 10. In this modified example, the portions denoted by the same reference numerals as in FIG. 4 have the same configurations as in FIG. 4. Therefore, description of the same portions is omitted, and only differences are described below.

The modified example is different from the construction shown in FIG. 1 in that the lamp unit 11 including the halogen lamps 23 is contained in the chamber 20. The connection between the lamp unit 11 and the constant-current controller 28 is not shown in the drawing. Although the construction shown in FIG. 6 is slightly complicated by connecting the lamp unit 11 provided in the chamber 20 to the outside, all partition walls of the chamber 20 can be formed by using a same metal to facilitate holding of air-tight performance because the lamp unit 11 is contained in the chamber 20.

On the other hand, when the lamp unit 11 is disposed outside the chamber 12, as shown in FIG. 4, the cover 13 including a light-transmitting wall is required. However, the device to supply a current to the lamp unit 11, and the device to control the lamp unit 11 can be disposed outside the chamber 12 to simplify the construction of the apparatus.

In the cover sealing apparatus 10 according to the present invention, the lamp unit 11 may be disposed outside or inside the chamber. In any of the cases, the cover sealing step described below can be performed without a trouble.

Next, the construction of the holding device 60 disposed in the chamber 12 of the cover sealing apparatus 10 shown in FIG. 4 is described in detail below.

Figure 9:
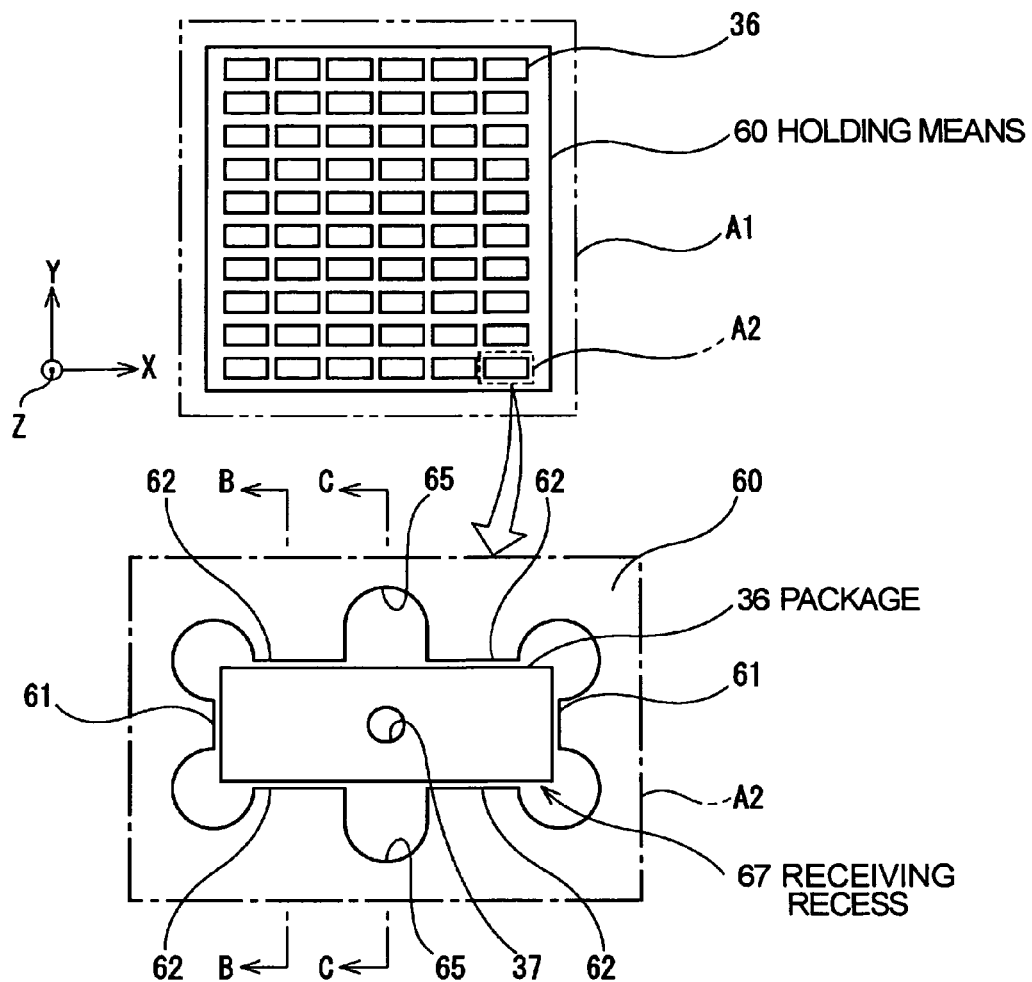
FIG. 9 is a schematic plan view showing a package holding device in the cover sealing apparatus shown in FIG. 4.

FIG. 9 is a schematic plan view of a state in which a plurality of the packages 36 or many packages 36 are arranged on the holding device 60. FIG. 9 includes an enlarged drawing of a region A2 corresponding to one package 36, which is shown in a lower portion.

Figure 10:
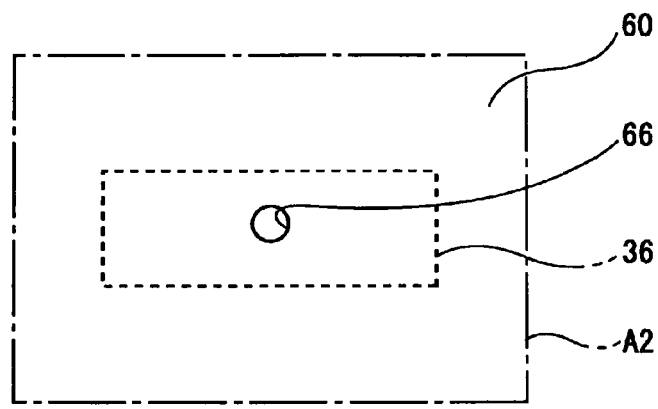
FIG. 10 is a bottom plan view of the region A2 of the holding device shown in FIG. 9.
Figure 11:
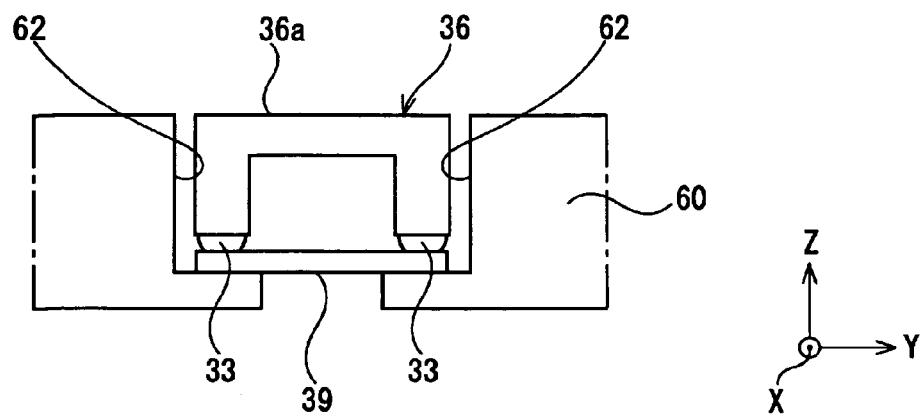
FIG. 11 is a schematic sectional view taken along plane B—B in FIG. 9.
Figure 12:
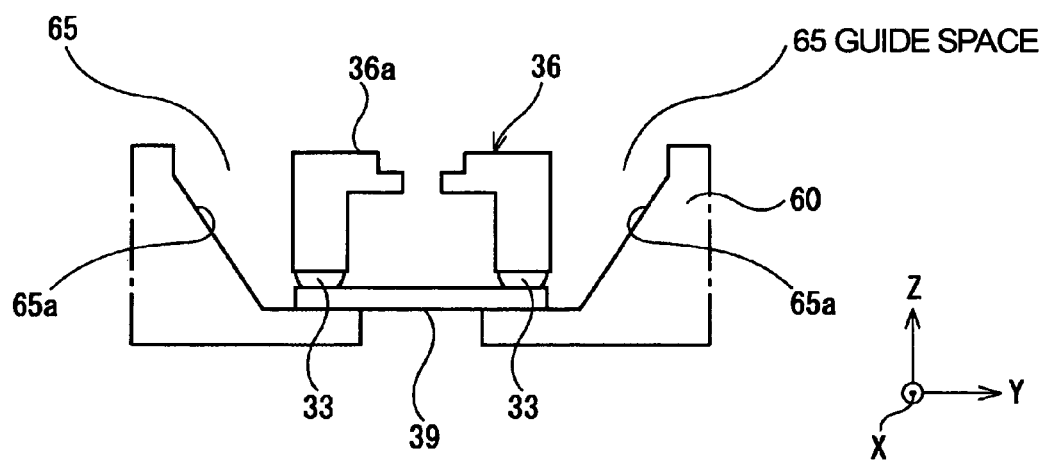
FIG. 12 is a schematic sectional view taken along plane C—C in FIG. 9.

FIG. 10 is a bottom view of the region A2, and FIGS. 11 and 12 are sectional views of the region A2 shown in FIG. 9, taken along planes B—B and C—C, respectively.

In FIG. 9, a region A1 indicates a range irradiated with the light beams L3 from the lamp unit 11 in the cover sealing step described below.

In FIG. 9, the holding device 60 preferably entirely includes a metal having high thermal conductivity. The holding device 60 is formed in, for example, a plate shape or table shape, having an upper surface which has receiving recesses 67 of a size sufficient to receive each of the packages 36. Each of the receiving recesses 67 includes a first positioning part 61 in contact with each of the respective short sides of the package 36, and second positioning parts 62 in contact with two positions of each of the long sides of the package 36.

Also, guide spaces 65 are formed in at least some of the portions between the adjacent positioning parts, to permit the operator to insert a jig, such as a pair of tweezers, therein. The guide spaces 65 are formed at opposite positions with each package 36 held therebetween, the package 36 being set with the cover 39 facing downward and the bottom 36a facing upward, as shown in FIGS. 11 and 12. Each of the guide spaces 65a preferably has a guide taper which gradually approaches the package 36 in the downward direction, as shown in FIG. 12. As a result, a pair of tweezers can be inserted into each of the spaces at the top of the holding device 60, and each of the packages 36 can be securely held at the bottom of the holding device 60.

Furthermore, as shown in FIG. 10, each of the packages 36 has a through hole 66 formed at the center of the cover 39, so that each package 36 can easily be removed from the holding device 60 by inserting a rod-shaped jib or the like into the through hole 66.

Next, a cover sealing method using the cover sealing apparatus 10 having the above-described construction according to the first exemplary embodiment is described below. The cover sealing method described below corresponds to an enhancement in the step ST2 of the method of manufacturing the piezoelectric device described above with reference to FIG. 25.

Figure 13:
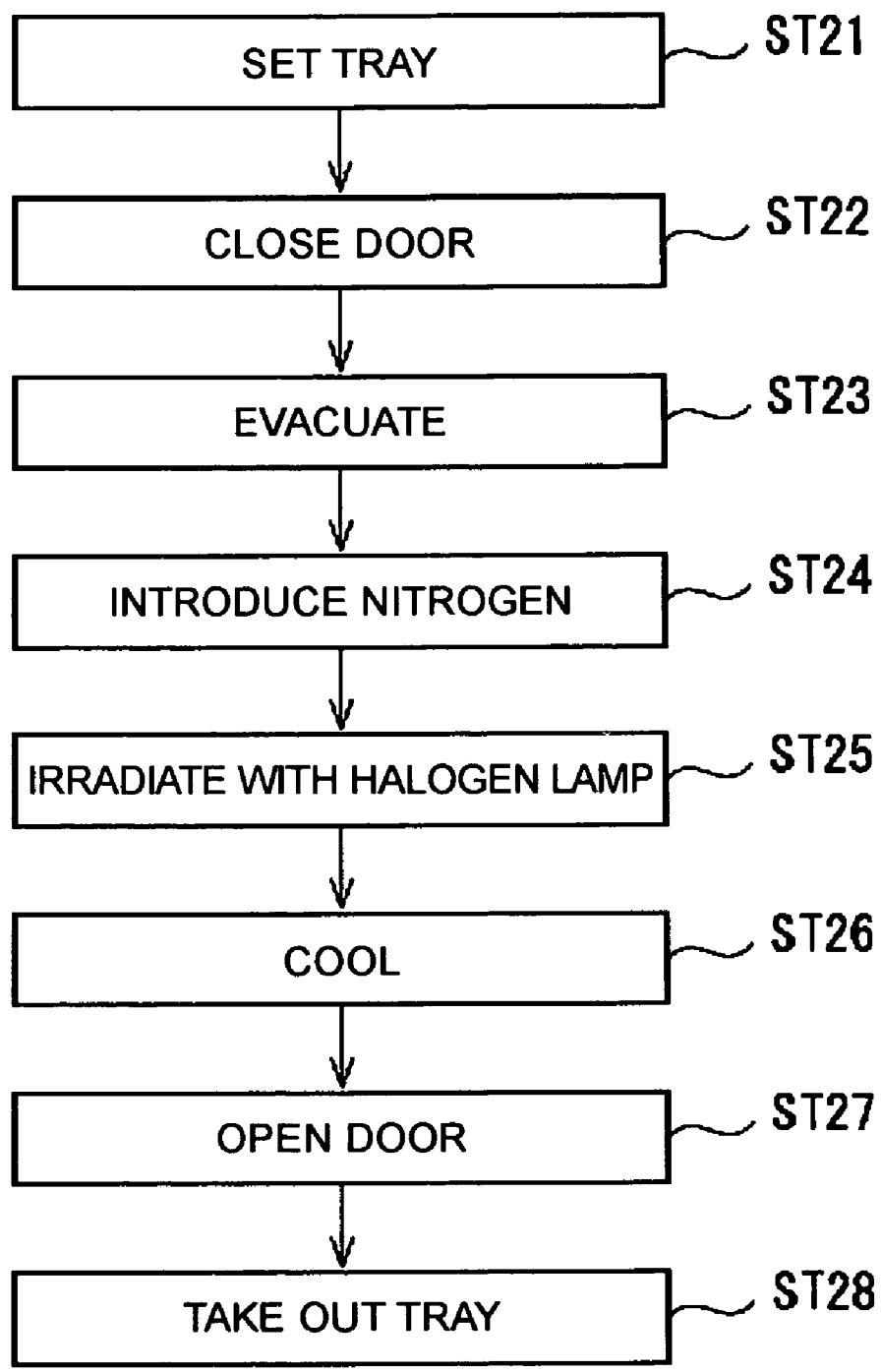
FIG. 13 is a flow chart showing a cover sealing method according to the first exemplary embodiment of the present invention.

FIG. 13 is a flow chart of the cover sealing method according to the first exemplary embodiment.

In FIG. 13, a plurality of the packages 36 are first set on the tray-like holding device 60, as described above with reference to FIGS. 9 to 12. In this step, each of the packages 36 is set on the holding device 60, with the bottom facing outward, i.e., the bottom facing upward in the drawing, as described above with reference to FIGS. 11 and 12 (ST21).

Next, the door 12a of the chamber 12 of the cover sealing apparatus 10 shown in FIG. 4 is opened, the holding device 60 on which the plurality of packages 36 are set at equal intervals in the X and Y directions is placed on the table 17, and then the door 12a is closed (ST22). Then, the control device 29 shown in FIG. 4 gives the evacuation device 21a instructions to discharge the air from the chamber 12 through the pipeline 21 to achieve a predetermined degree of vacuum in the chamber 12 while monitoring a signal output from the gas sensor 19 (ST23). Then, nitrogen is introduced into the chamber 12 from the nitrogen supply device 21*b* through the pipeline 21 according to the instructions from the control device 29 (ST24).

Next, the lamp unit 11 is moved to an initial work position by a moving device (not shown). In this state, all packages 36 set on the holding device 60 are arranged at a substantially equal distance from the lamp unit 11. In this state, cover sealing is started, and the temperature is monitored by the sensing device 16 disposed near the holding device 60 or near its back in the chamber 12 according to the instructions from the control device 29. For example, when the temperature sensed by the sensing device 16 exceeds a predetermined value in subsequent steps, the control device 29 gives instructions to supply the cooling water from the cooling water supply device 22*a* and circulating the cooling water in the chamber 12.

Specifically, in the cover sealing step, the driving current from the AC power supply is converted into the constant-voltage driving current by the constant-current controller 28, and then applied to the driving circuit (not shown) of each of the lamps 23 of the lamp unit 11. As a result, the entire region A1 shown in FIG. 9 is irradiated with the light beams L3 from the halogen lamps 23 of the lamp unit 11 (ST25).

Figure 14:
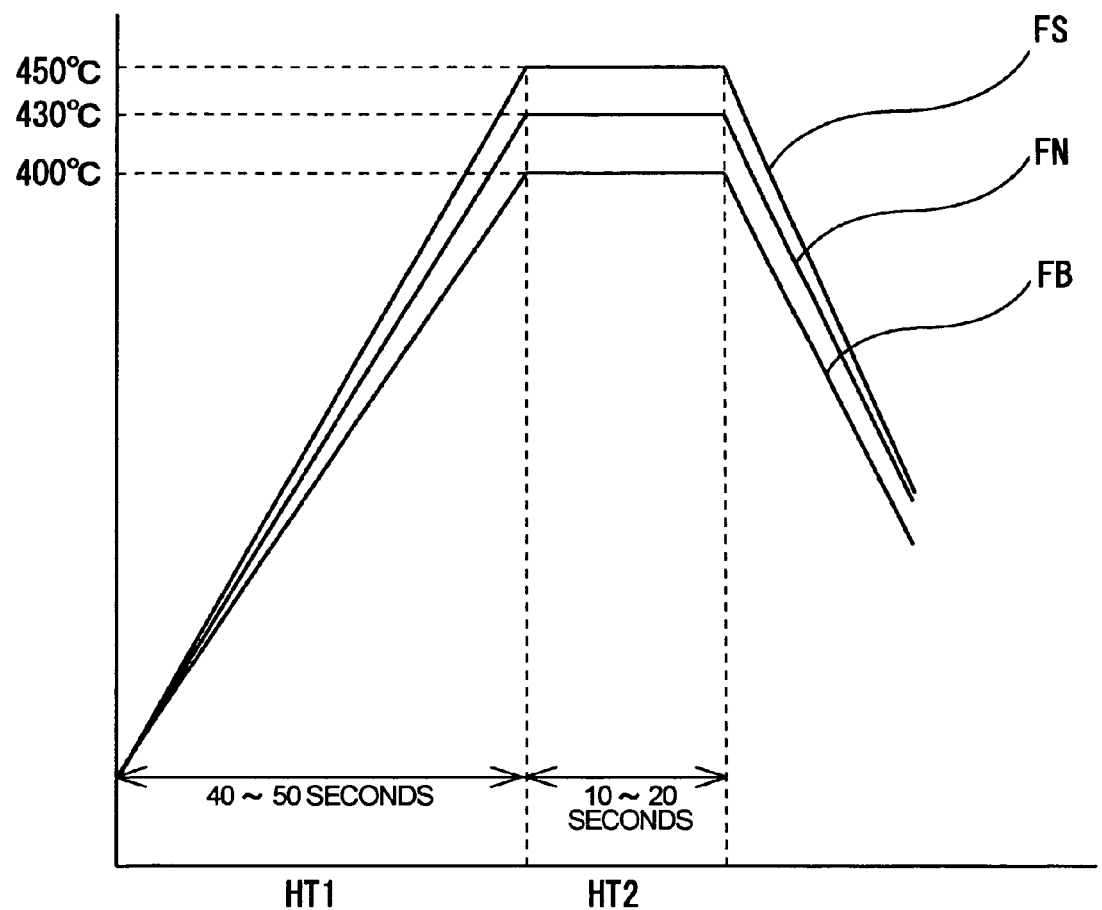
FIG. 14 is a graph showing a heating temperature profile in the cover sealing method shown in FIG. 13.

FIG. 14 is a graph showing an example of a heating temperature profile in the step ST25. In FIG. 14, FS represents the monitored values of the surface temperature of the cover 39 to be fixed to the heated package 36, FN represents the monitored values of the temperature of a position adjacent to the surface of the cover 39, and FB represents the monitored values of the temperature of the back of the cover 39.

Figure 15:
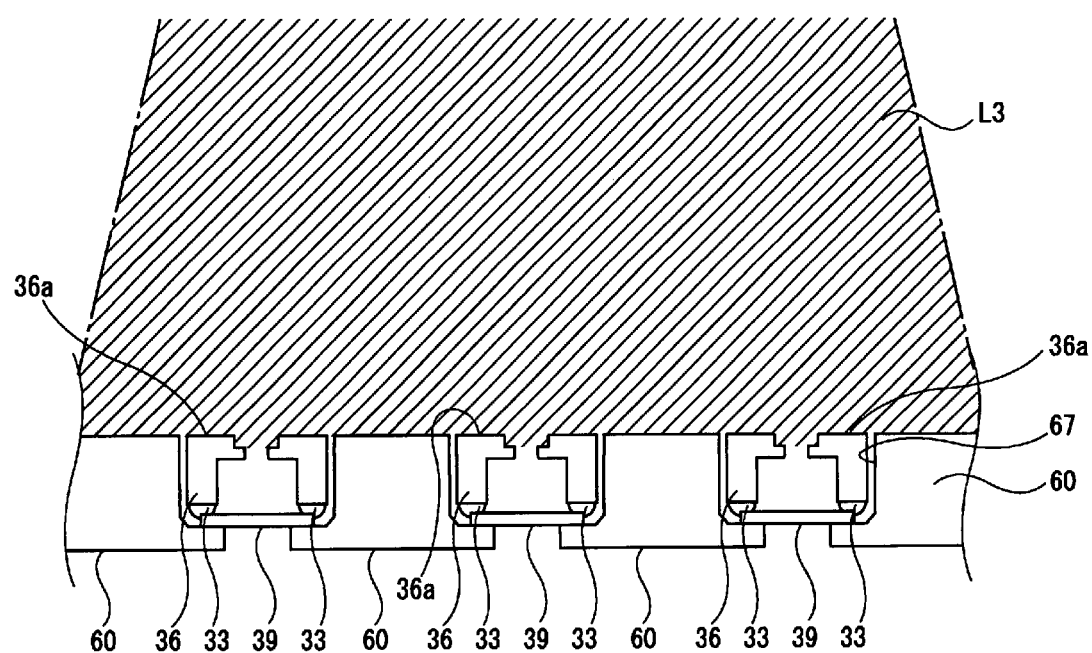
FIG. 15 is an enlarged partial sectional view showing a state in which a light beam is emitted from a lamp unit of the cover sealing apparatus shown in FIG. 4 to seal packages with covers in the cover sealing method shown in FIG. 13.

FIG. 15 is an enlarged partial sectional view showing a state in which the packages 36 are sealed with the covers 39 by irradiation of the light beam L3 from the lamp unit 11 of the cover sealing apparatus 10 shown in FIG. 4.

In FIG. 14, the first heating time HT1 from the start of irradiation of the light beam L3 of the halogen lamps 23 is several tens seconds from the start, but the temperature of the back FB (the upper surface of the cover 39 in the drawing) of the cover 39 shown in FIG. 15 exceeds 400° C. Therefore, even when a brazing material 33 having a higher melting point than that of a lead-containing brazing material is used, the brazing material can be sufficiently melted. For example, even when lead-free low-melting-point glass (melting temperature of 430° C.) is used as the brazing material 33, a temperature sufficient to melt the brazing material can be rapidly attained. Next, heating is continued for the second heating time HT2 of about 10 seconds to securely bond the cover 39 to each package 36 with the brazing material 33.

Namely, in the case shown in FIG. 15, the bottoms 36*a* of the packages 36, and the holding device 60 are heated by the light beam L3 from the halogen lamps 23, and heat is transmitted to the brazing material 33 through each cover 39. Thus, the brazing material 33 is melted to bond the cover 39 and each of the packages 36 together.

Next, the control device 29 instructs the cooling water supply device 22*a* to supply and circulate the cooling water in the chamber 12, to decrease the temperature in the chamber 12 to a predetermined temperature while monitoring the temperature by the sensing device 16 (ST26).

Then, the door 12*b* shown in FIG. 4 is opened (ST27), and then the holding device 60 is removed from the chamber 12 to the outside (ST28) to complete the cover sealing step.

In this exemplary embodiment, the cover sealing step is performed by using the light beams, from the halogen lamps 23 of the cover sealing apparatus 10, thereby permitting irradiation of light beams within a wide range as compared with the use of a laser beam. Therefore, in comparison to a focused narrow light beam, such as a laser beam, the effective heating range can be extended to permit cover sealing by batch processing in which a plurality of the packages 36 are simultaneously heated from the bottoms. Furthermore, the time required to heat to a temperature necessary to seal is short to shorten the total heating time, as compared with the use of a belt furnace having a heating device including a heating wire. Therefore, the structure in each of the packages is less adversely affected by heat.

Also, even when a lead-free high-melting-point brazing material is used as the brazing material 33 to fix the covers 39, the brazing material 33 can be heated to a melting temperature within a short time.

During heating, the inert gas, for example, nitrogen, is introduced into the chamber 12, and thus the light beams from the halogen lamps 23 can be transmitted through nitrogen to melt the brazing material, and oxidative deterioration of jigs, such as the holding device 60 and the like in the chambers 12, can be reduced or effectively prevented.

Furthermore, in comparison to a cover sealing apparatus using a laser beam, the cover sealing apparatus 10 uses the halogen lamps 23 as light sources provided in the lamp unit 11, and thus a special power supply and other apparatuses, such as a laser generator are not required to permit driving with a home AC power supply. Therefore, the cover sealing apparatus 10 can be formed at a low cost, and can be used without limit of the environment, thereby simplifying the apparatus. Thus, the cover sealing step can be performed without the selection of place.

Figure 16:
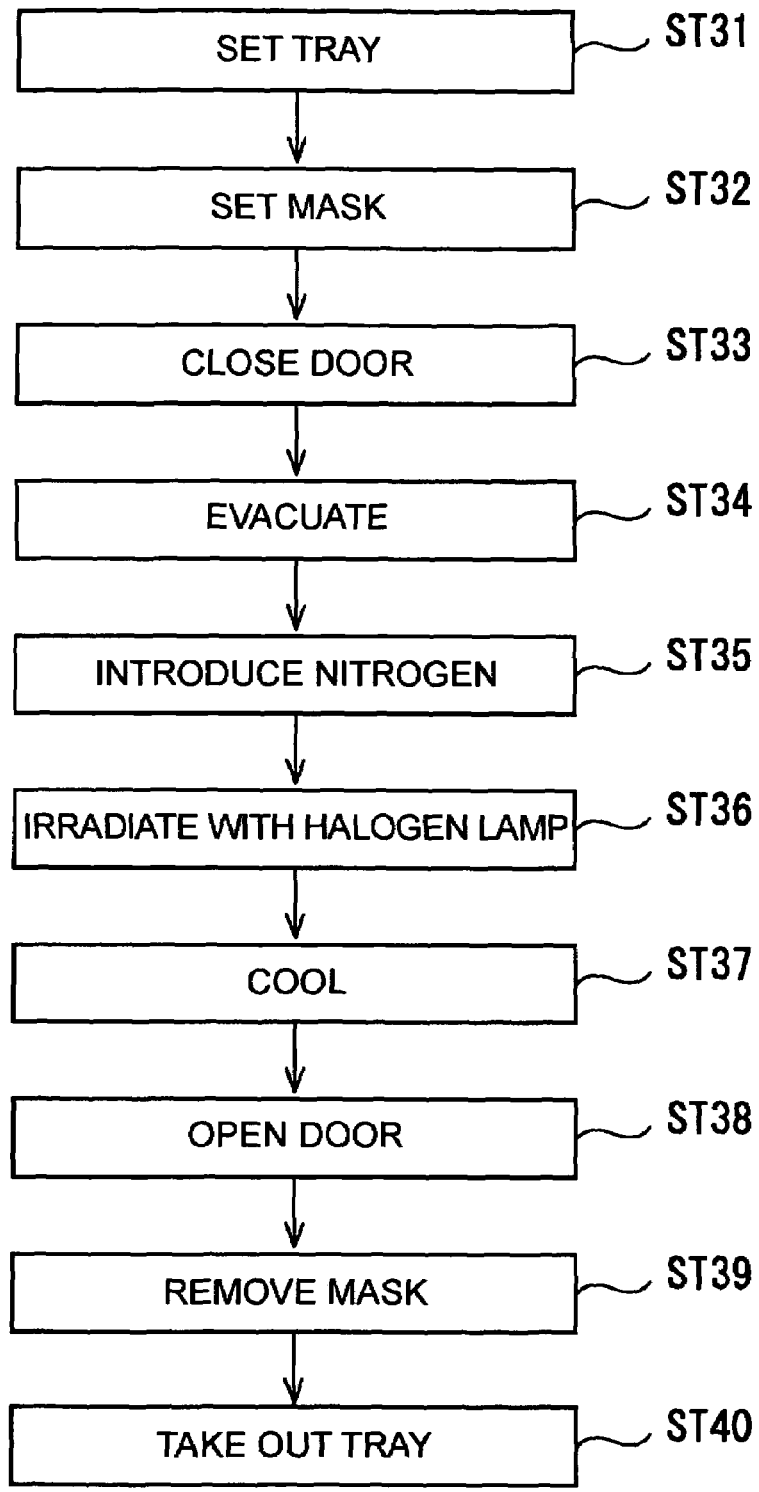
FIG. 16 is a flow chart showing a cover sealing method according to a second exemplary embodiment of the present invention.

FIG. 16 is a flow chart of a cover sealing method according to a second exemplary embodiment of the present invention.

Figure 17:
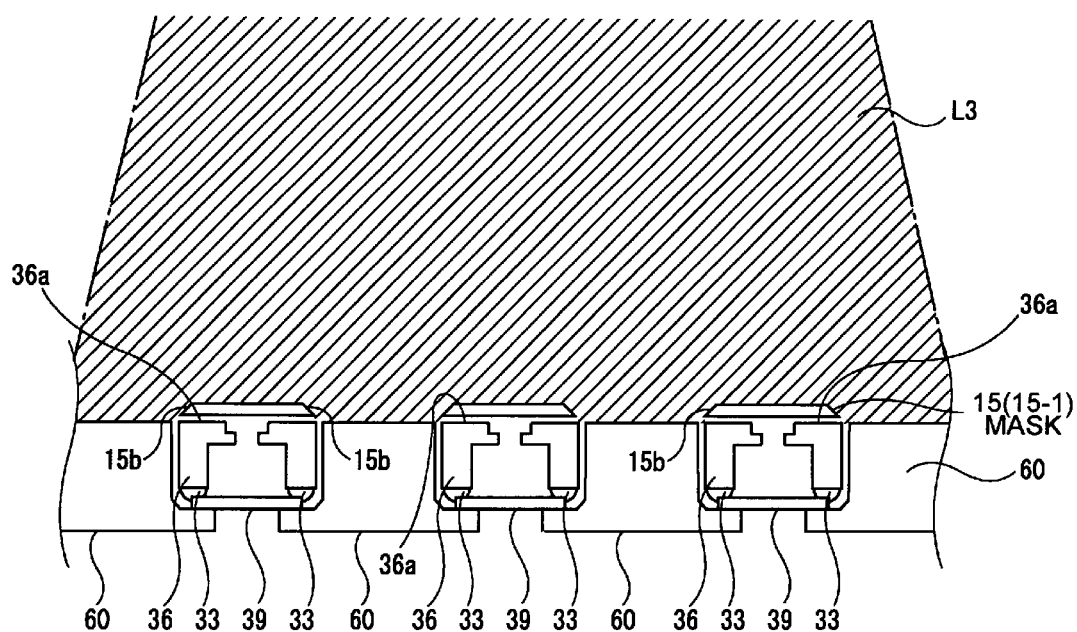
FIG. 17 is an enlarged partial sectional view showing a state in which a light beam is emitted from a lamp unit of the cover sealing apparatus shown in FIG. 4 to seal packages with covers in the cover sealing method shown in FIG. 16.

FIG. 17 is an enlarged partial sectional view showing a state in which the packages 36 are sealed with the covers 39 by irradiation of the light beam L3 from the lamp unit 11 of the cover sealing apparatus 10 shown in FIG. 4.

In FIG. 16, a plurality of the packages 36 are set on the tray-like holding device 60, as described above with reference to FIGS. 9 to 12. This step is the same as the step ST21 of the first exemplary embodiment (ST31).

Next, as shown in FIG. 17, a mask 15 is disposed to completely cover all packages 36 arranged on the holding device 60 (ST32). In this case, the mask 15-1 has another form to cover the bottom parts or bottom surfaces 36*a* of the packages 36. Namely, the mask 15-1 has through holes 15*b* formed at positions corresponding to the packages 36 so as to shield the packages 36 and expose the holding device 60.

The subsequent steps ST33, ST34 and ST35 are the same as the steps ST22, ST23 and ST24, respectively, shown in FIG. 13, and thus duplicated description is omitted. The step ST36 is substantially the same as the step ST25 shown in FIG. 13 except that the mask 15-1 different from that used in the step ST25 is used, as described above with reference to FIG. 17.

Therefore, the packages 36 are covered with the mask 15-1 to reduce or effectively prevent irradiation of the packages 36 with the light beam L3 from the halogen lamps 23, and heat the holding device 60 not covered with the mask 15-1. The heat of the holding device 60 is transmitted to the covers 39 and the brazing material 33 to effectively melt the brazing material 33 with reducing or avoiding heat damage to the packages 36 as much as possible.

The steps ST37 and ST38 are the same as the steps ST26 and ST27, respectively, shown in FIG. 13. In this exemplary embodiment, the mask 15-1 is removed from the holding device 60 (ST39), and then the holding device 60 is taken out of the chamber 12 (ST40) to complete the cover sealing step.

The second exemplary embodiment exhibits the same operation and effect as the cover sealing method of the first exemplary embodiment.

Figure 18:
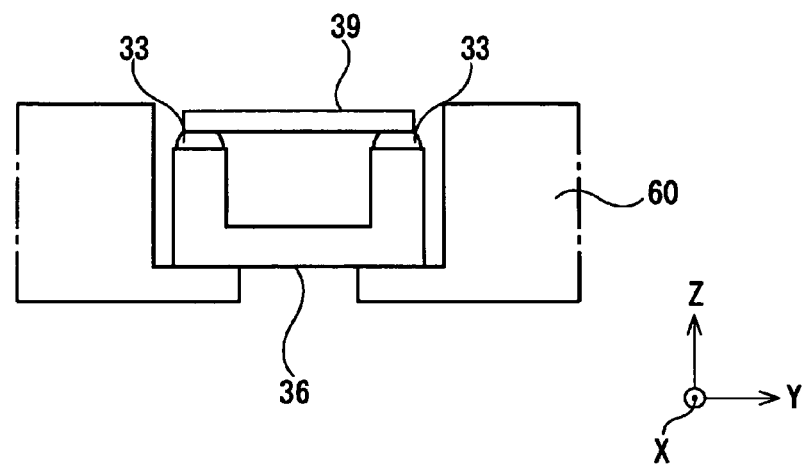
FIG. 18 is a schematic corresponding to FIG. 11, which shows a state in which a package is set on a holding device in each of third and fourth exemplary embodiments.
Figure 19:
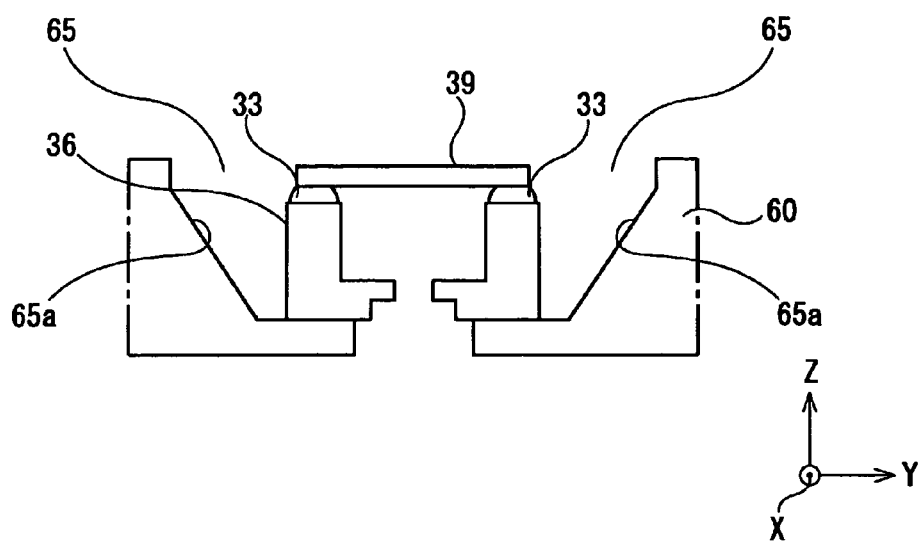
FIG. 19 is a schematic corresponding to FIG. 12, which shows a state in which a package is set on a holding device in each of the third and fourth exemplary embodiments.

FIGS. 18 and 19 are schematics showing a state in which a package 36 is set on the holding device 60 shown in FIG. 9 by each of cover sealing methods according to third and fourth exemplary embodiments. FIGS. 18 and 19 correspond to FIGS. 11 and 12, respectively.

Figure 20:
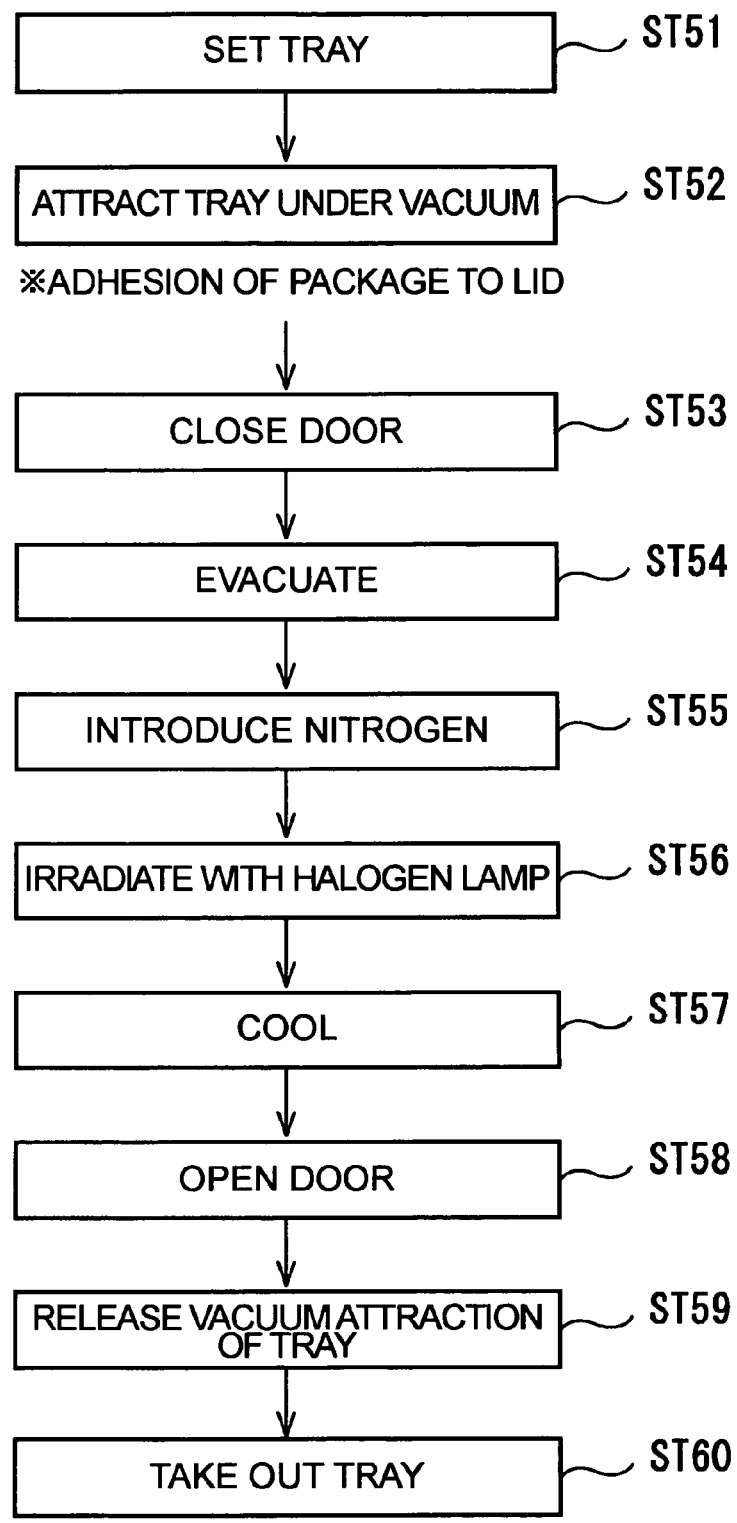
FIG. 20 is a flow chart of a cover sealing method according to the third exemplary embodiment of the present invention.
Figure 21:
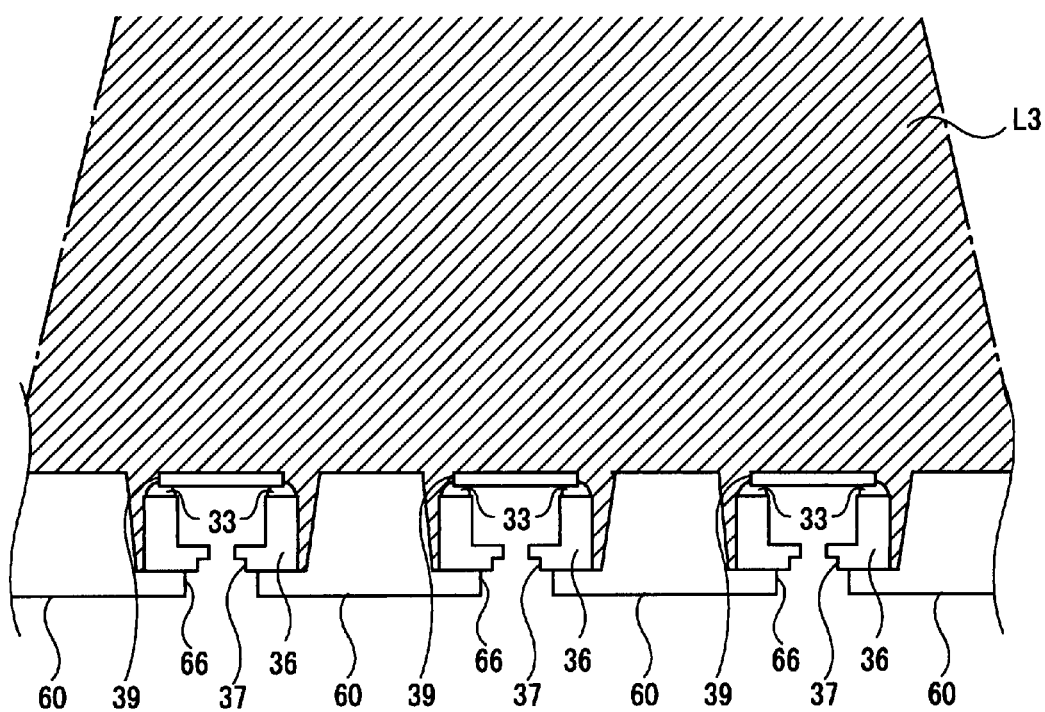
FIG. 21 is an enlarged partial sectional view showing a state in which a light beam is emitted from a lamp unit of the cover sealing apparatus shown in FIG. 4 to seal packages with covers in the cover sealing method shown in FIG. 20.

FIG. 20 is a flow chart of the cover sealing method according to the third exemplary embodiment of the present invention, and FIG. 21 an enlarged partial sectional view showing a state in which packages 36 are sealed with covers 39 by irradiation of light beam L3 from the lamp unit 11 of the cover sealing apparatus 10 shown in FIG. 4.

In FIGS. 18 and 19, the packages 36 are set on a holding device 60 with the covers 39 facing upward. Namely, in the cover sealing method of this exemplary embodiment, each of the packages 36 set on the holding device 60 in the first and second exemplary embodiments is reversed in the vertical direction.

In FIG. 20, first, a plurality of the packages 36 are set on the tray-like holding device 60, as shown in FIGS. 18 and 19 (ST51).

Next, the packages 36 are adhered to the holding device 60 by evacuation with a vacuum attraction device (not shown in the drawing) using through holes 66 of the holding device 60 shown in FIG. 21 to hold the packages 36 on the holding device 60 (ST52). In this step, the covers 39 are also adhered to the holding device 60 by use of through holes 37 of the packages 36.

The subsequent steps ST53, ST54 and ST55 are the same as the steps ST22, ST23 and ST24, respectively, shown in FIG. 13, and thus duplicated description is omitted. The step ST56 is substantially the same as the step ST25 shown in FIG. 13 except that the covers 39 of the packages 36 are irradiated with the light beam L3 from the halogen lamps, as shown in FIG. 21.

In this exemplary embodiment, the heat of the light beam L3 from the halogen lamps is mainly transmitted from the covers 39 to the brazing material 33. As a result, the brazing material 33 is melted to bond the covers 39 to the packages 36 in the same manner as in the other exemplary embodiments.

The subsequent steps ST57 and ST58 are the same as the steps ST26 and ST27, respectively, shown in FIG. 13. In this exemplary embodiment, vacuum attraction of the packages 36 performed in the step ST52 is released (ST59), and then the holding means 60 is taken out of the chamber 12 (ST60) to complete the cover sealing step.

The third exemplary embodiment exhibits the same operation and effect as the cover sealing method of the first exemplary embodiment.

Figure 22:
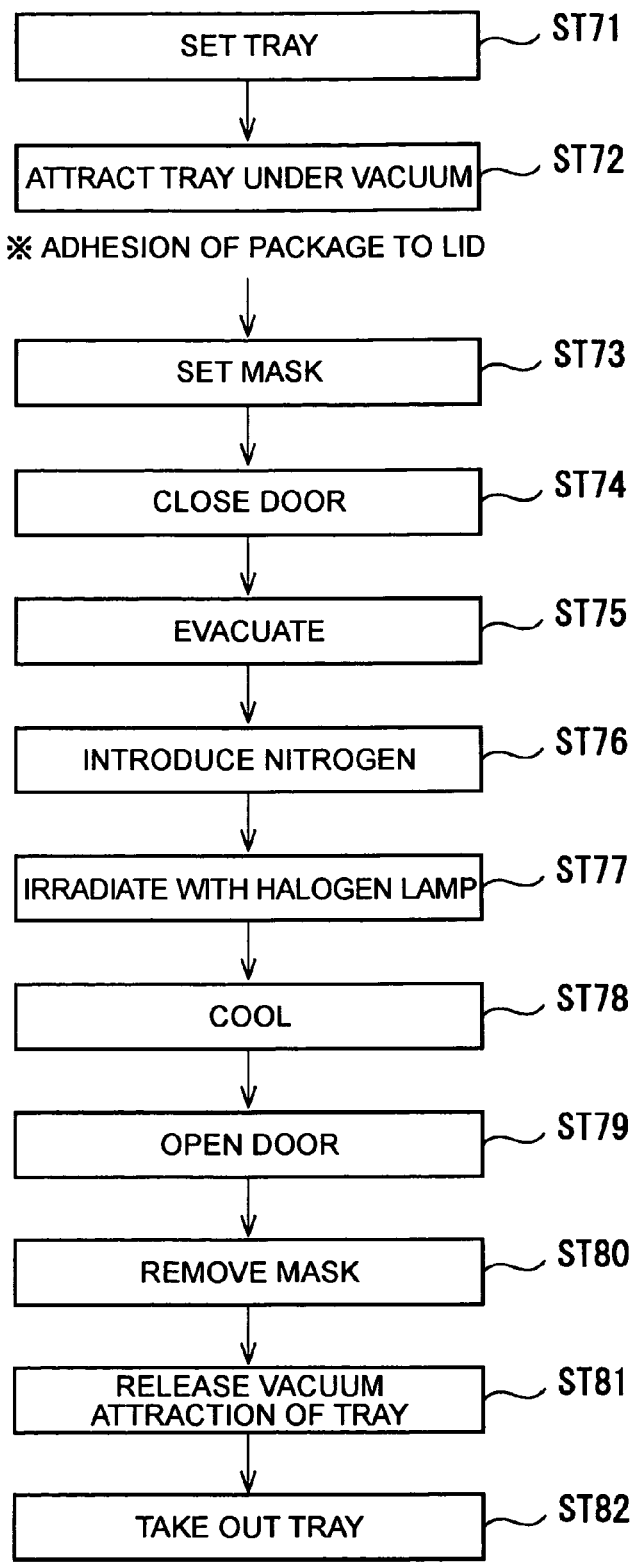
FIG. 22 is a flow chart of a cover sealing method according to the fourth exemplary embodiment of the present invention.
Figure 23:
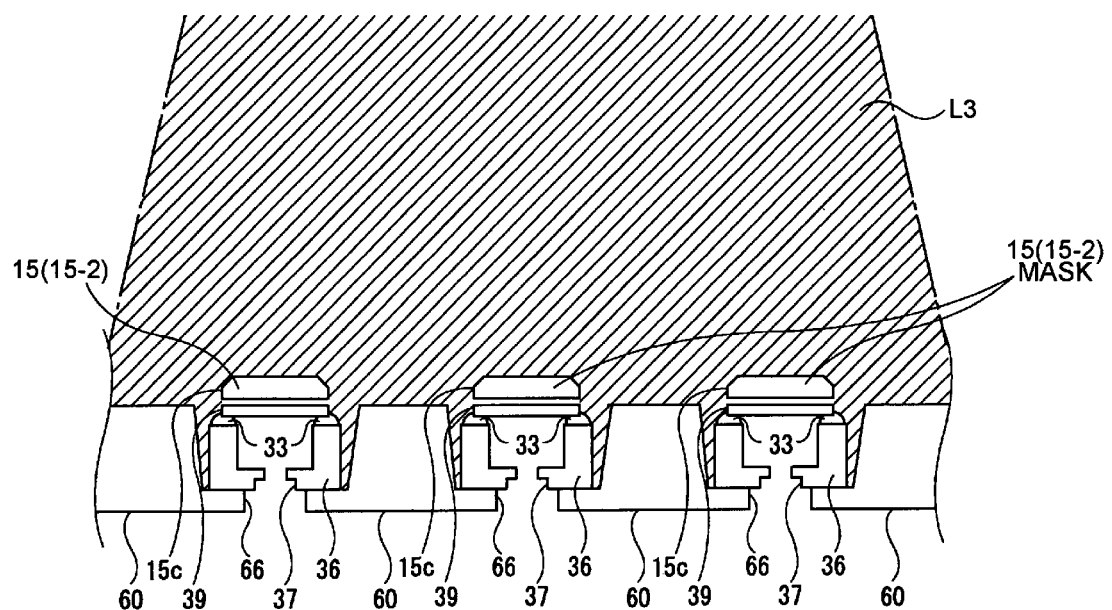
FIG. 23 is an enlarged partial sectional view showing a state in which a light beam is emitted from a lamp unit of the cover sealing apparatus shown in FIG. 4 to seal packages with covers in the cover sealing method shown in FIG. 22.

FIG. 22 is a flow chart of the cover sealing method according to the fourth exemplary embodiment of the present invention, and FIG. 23 an enlarged partial sectional view showing a state in which packages 36 are sealed with covers 39 by irradiation of light beam L3 from the lamp unit 11 of the cover sealing apparatus 10 shown in FIG. 4.

This exemplary embodiment is different from the third exemplary embodiment in that a mask 15-2 is used, as shown in FIG. 23.

Namely, in FIG. 22, first, a plurality of the packages 36 are set on the tray-like holding device 60, as shown in FIGS. 18 and 19 (ST71).

Next, the packages 36 are adhered to the holding device 60 by evacuation with a vacuum attraction device (not shown in the drawing) using through holes 66 of the holding device 60 shown in FIG. 23 to hold the packages 36 on the holding device 60. In this step, the covers 39 are also adhered to the holding device 60 by use of through holes 37 of the packages 36(ST72).

Next, as shown in FIG. 23, a mask 15 is disposed to completely cover the covers 39 of all packages 36 arranged on the holding device 60 (ST73). In this case, the mask 15-2 has still another form to cover portions other than at least the sealing margins of the covers 39 of the packages 36. Namely, the mask 15-2 has through holes 15c formed at position corresponding to the packages 36 so as to shield the covers 39 of the packages 36 and expose the holding device 60.

The subsequent steps ST74, ST75 and ST76 are the same as the steps ST22, ST23 and ST24, respectively, shown in FIG. 13. The steps ST77 and ST76 are the same as the steps ST25 and ST26, respectively, shown in FIG. 13. Particularly, in the step ST77 in which the packages 36 are irradiated with the light beam L3 from the halogen lamps 23, as shown in FIG. 23, the covers 39 of the packages 36 are covered with the mask 15-2 to reduce or effectively prevent irradiation of the covers 39 with the light beam L3 from the halogen lamps 23, and heat the holding device 60 not covered with the mask 15-2. The heat of the holding device 60 is transmitted to the brazing material 33 to effectively melt the brazing material 33 reducing or avoiding heat damage to the packages 36 as much as possible.

The subsequent steps ST78 and ST79 are the same as the steps ST26 and ST27, respectively, shown in FIG. 13. In this exemplary embodiment, the mask 15-2 is removed from the holding device 60 (ST80), vacuum attraction of the packages 36, which is performed in the step ST72, is released (ST81), and then the holding device 60 is taken out of the chamber 12 (ST82) to complete the cover sealing step.

The fourth exemplary embodiment exhibits the same operation and effect as the cover sealing method of the first exemplary embodiment.

Figure 24:
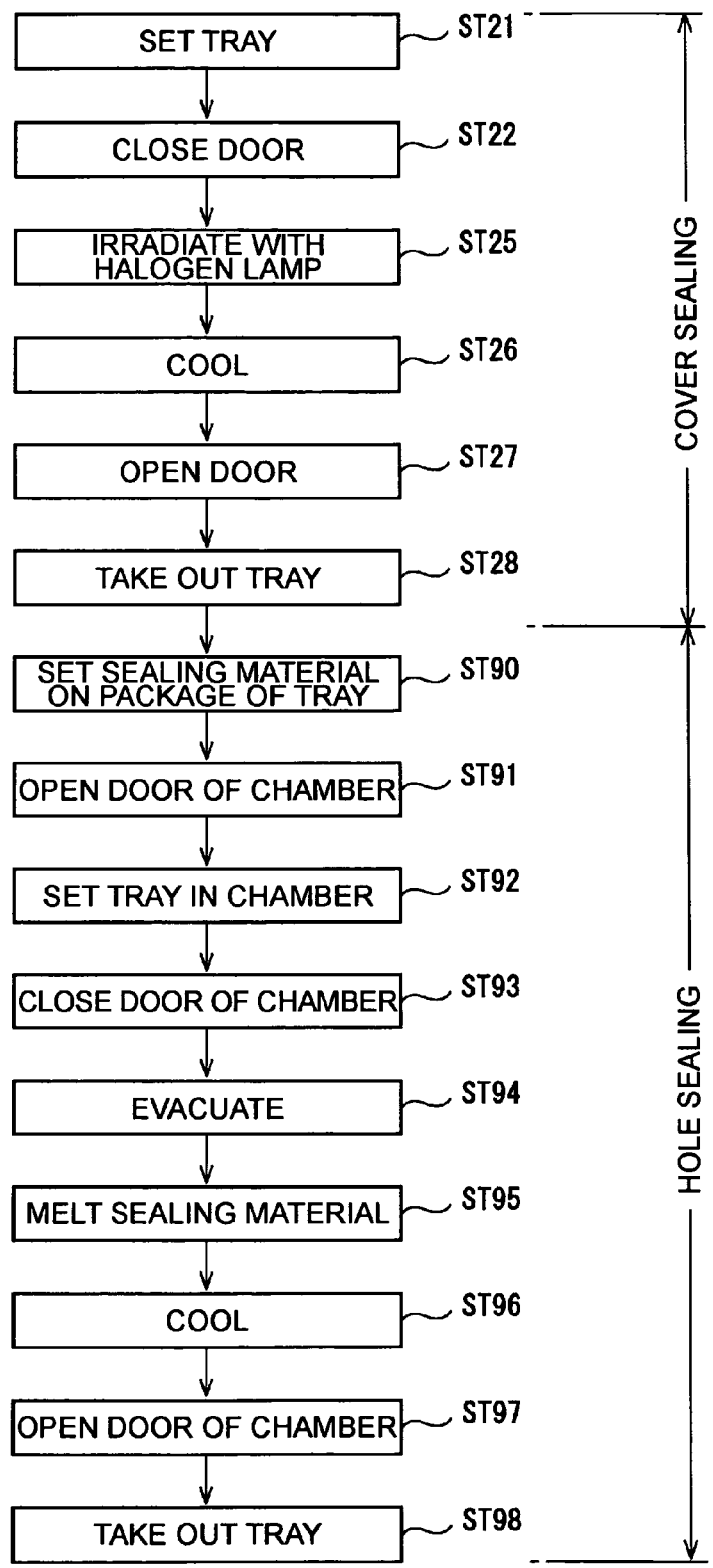
FIG. 24 is a flow chart illustrating characteristic steps of a method of manufacturing a piezoelectric device according to a fifth exemplary embodiment in comparison to the first exemplary embodiment.

FIG. 24 is a flow chart illustrating the characteristic steps of a method of manufacturing a piezoelectric device according to a fifth exemplary embodiment of the present invention.

In FIG. 24, the same elements as in the first exemplary embodiment are denoted by the same reference numerals, and duplicated description is omitted. Thus, differences are mainly described below.

Figure 28:
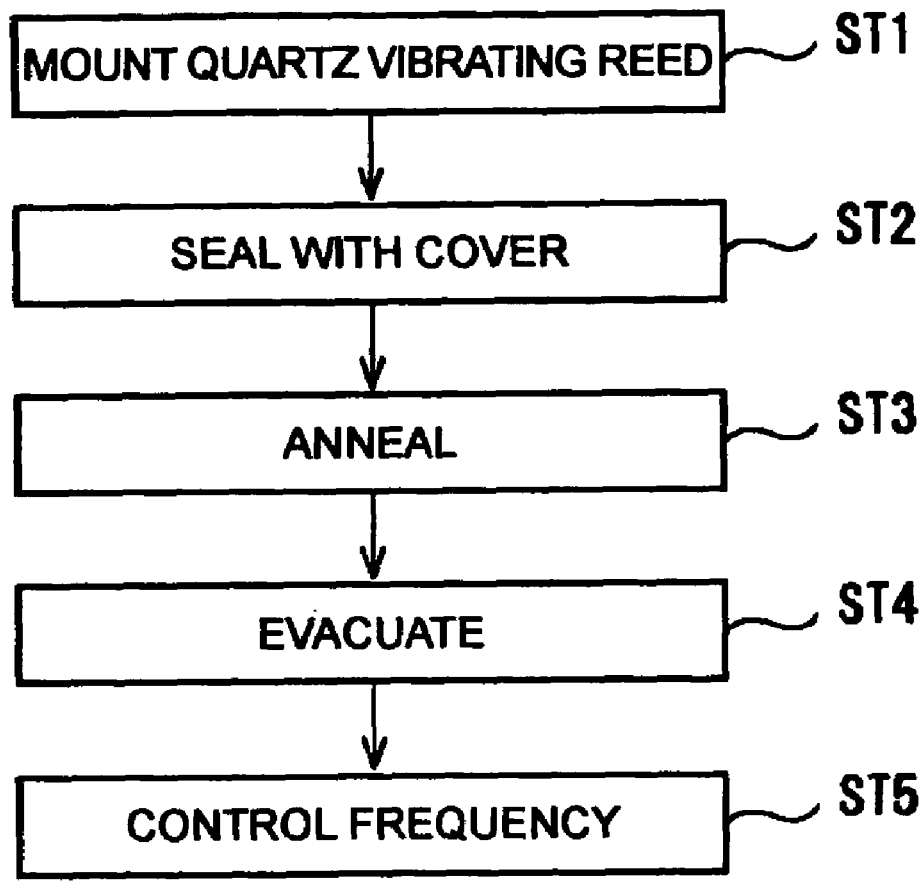
FIG. 28 is a flow chart schematically showing a method of manufacturing a piezoelectric device.
Figure 29:
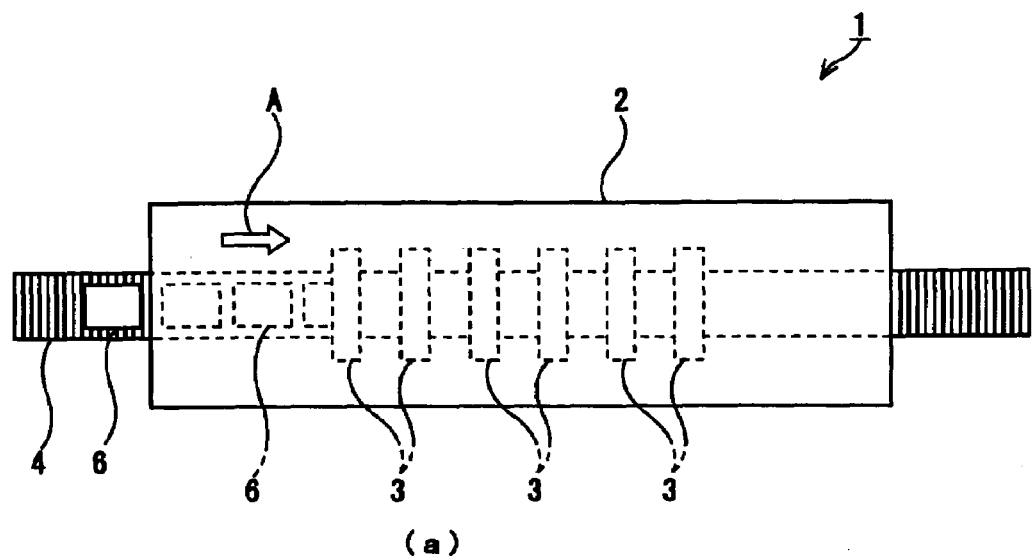
FIGS. 29(a) and 29(b) are schematics illustrating a related art cover sealing apparatus for a piezoelectric device.
Figure 29:
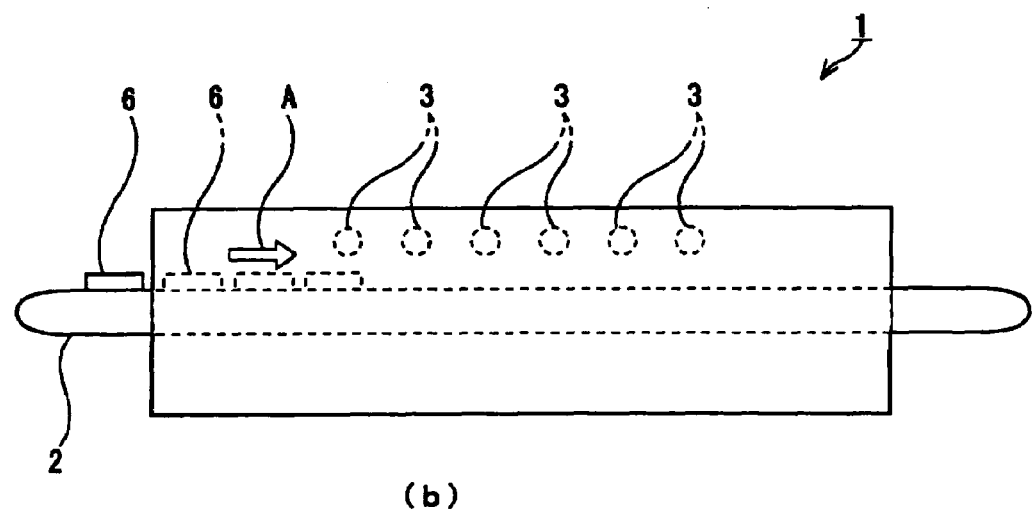
Figure 30:
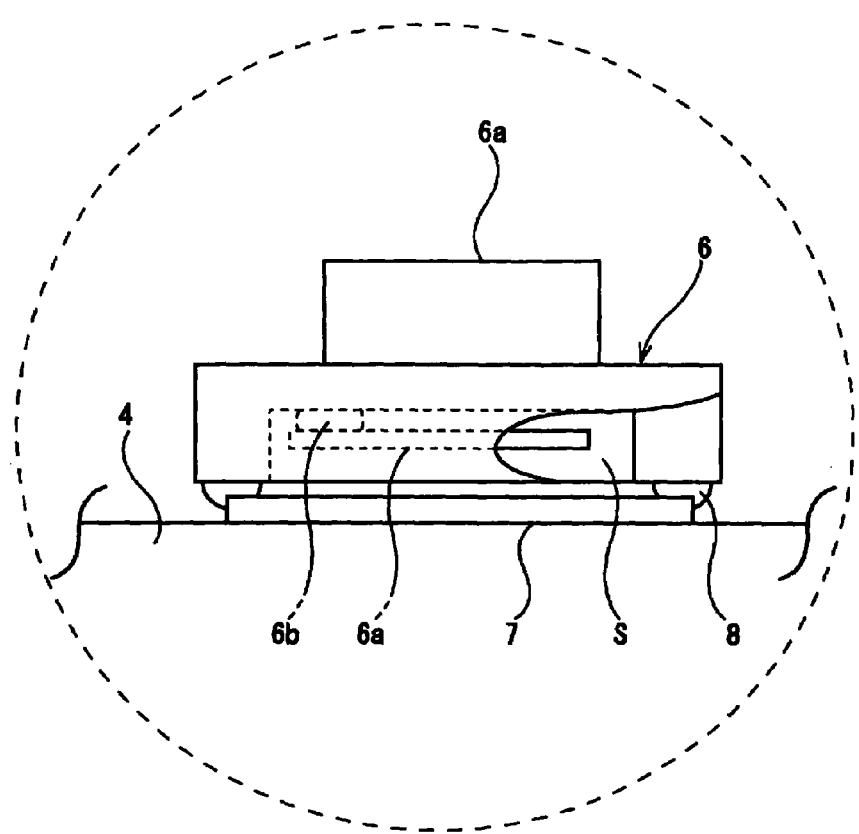
FIG. 30 is a schematic illustrating the construction of a heating device used in the cover sealing apparatus shown in FIGS. 29(a) and 29(b)
Figure 31:
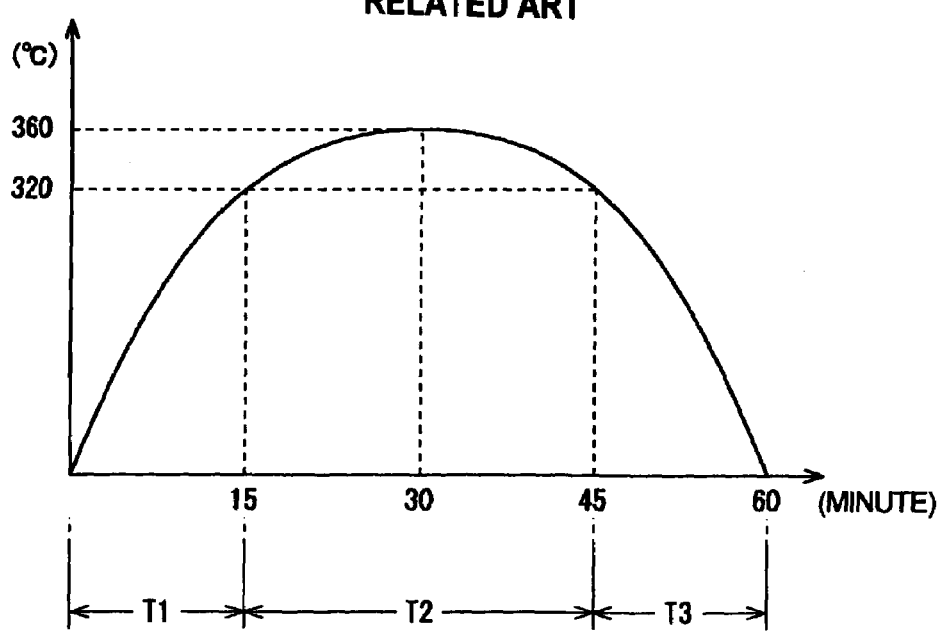
FIG. 31 is a graph showing a heating temperature profile of the cover sealing apparatus shown in FIGS. 29(a) and 29(b)
Figure 32:
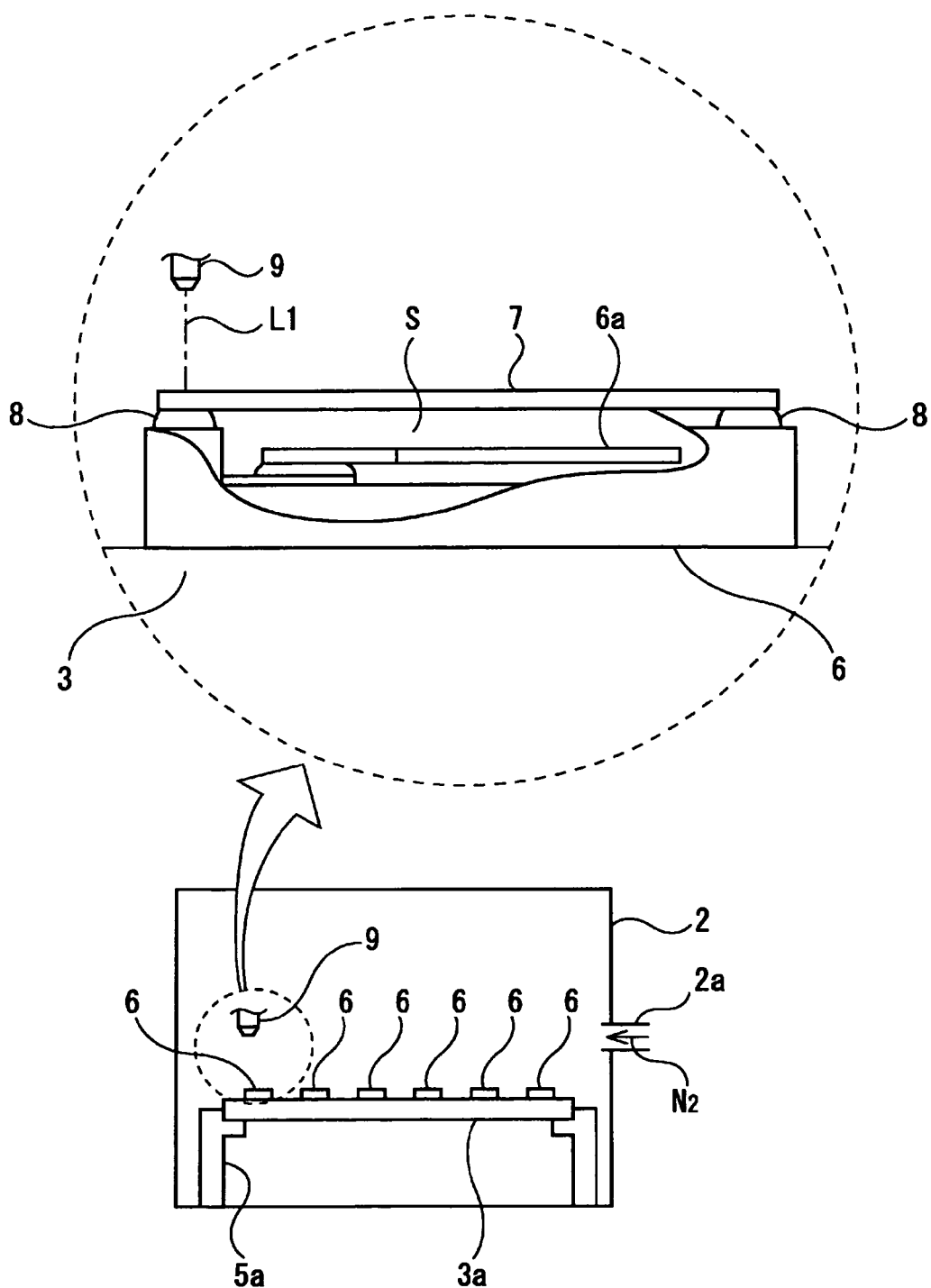
FIG. 32 is a schematic side view showing a state in which a package is sealed with a cover by a laser beam.

Like in a related art method of manufacturing a piezoelectric device, in the method of manufacturing a piezoelectric device of the fifth exemplary embodiment, a piezoelectric vibrating reed is first fixed to an electrode, which is previously formed in a package, with a conductive adhesive (refer to ST1 shown in FIG. 28).

Figure 25:
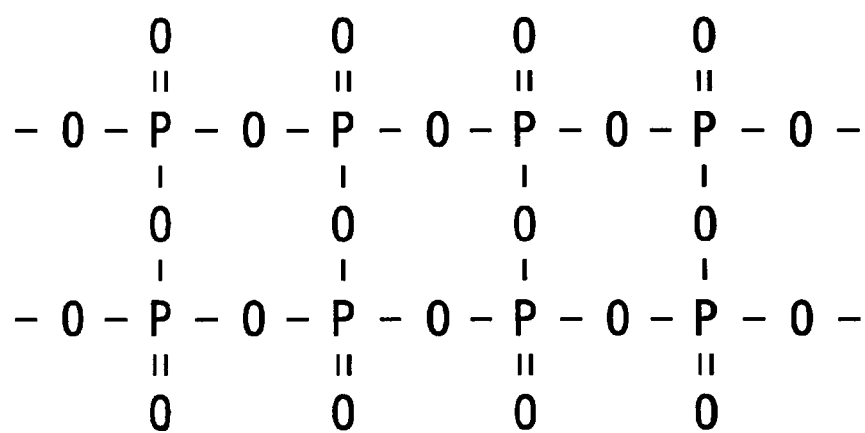
FIG. 25 is a schematic of a glass network structure composed of phosphate glass.

Next, as shown in FIG. 24, the package is sealed with a cover by using a brazing material (cover sealing). Namely, as described above in the first exemplary embodiment shown in FIG. 13, the door 12a of the chamber 12 of the cover sealing apparatus 10 is opened to dispose the holding device 60, on which the packages 36 are set, on the table 17 (ST21), and then door 12a is closed (ST22). As described above, the brazing material 33 is disposed at the open upper end of each of the packages 36 set on the holding device 60 (refer to FIG. 11), and a brazing material including a compound of oxygen and metal atoms is used as the brazing material 33. In the fifth exemplary embodiment, the brazing material 33 includes mother glass and a filler, the mother glass being phosphate glass having a glass network structure composed of P (phosphorus) which forms network ions $P^{5+}$, and O (oxygen atom), as shown in FIG. 25.

Then, irradiation of the light beams L3 from the halogen lamps 23 is performed (ST25) without evacuating the chamber 12 of the cover sealing apparatus 10 (ST23 in FIG. 13), and introducing nitrogen (ST24 in FIG. 13), which are described above in the first exemplary embodiment. Therefore, irradiation of the light beams L3 from the halogen lamps 23 is performed in the air.

The subsequent steps ST26, 27 and 28 are the same as those shown in FIG. 13, and thus duplicated description is omitted.

Figure 26:
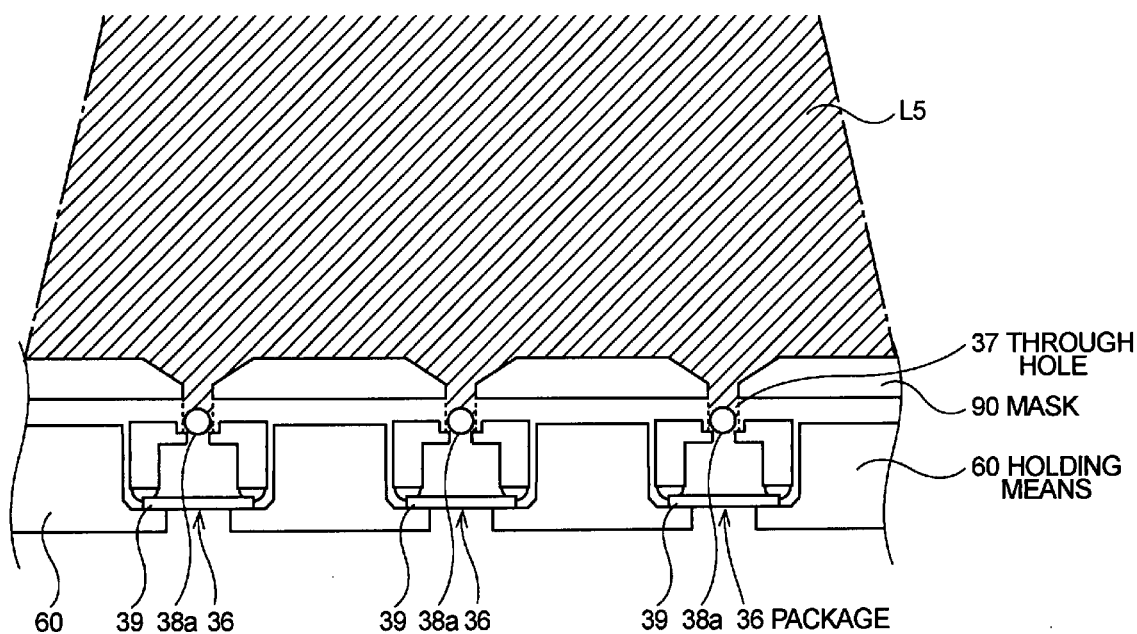
FIG. 26 is a schematic illustrating a hole sealing step.

Next, as shown in FIG. 24, a hole sealing step is performed. Namely, as shown in FIG. 26 illustrating the hole sealing step, an unmelted sealing material 38a composed of, for example, silver solder, Au/Sn, Au/Ge, or the like is disposed in each of the through holes 37 of the packages 36 set on the holding device 60 after the cover sealing step (ST90). Then, a mask 90 is disposed on the packages 36 so as to irradiate only the unmelted sealing material 38a with light beams from the halogen lamps described below, Then, a door (not shown) of a chamber for the hole sealing step is opened (ST91) to set the holding device 60 in the chamber (ST92). After the door is closed (ST93), the chamber is evacuated the same way as in the first exemplary embodiment, for example, a vacuum pump or the like to evacuate the internal spaces S of the packages 36 through the through holes 37 (ST94). Then, as shown in FIG. 26, only the unmelted sealing material 38a disposed in each of the through holes 37 of the packages 36 is melted by irradiation of the light beams L5 from the halogen lamps in a vacuum atmosphere in the chamber (not shown) (ST95). The sealing material 38a may be melted by irradiation of a laser beam. Then, the sealing material 38a is cooled (ST96), the door (not shown) of the chamber is opened (ST97) to take out the holding device 60 (ST98), completing the hole sealing step.

Then, like in the related art method of manufacturing a piezoelectric device, the electrode of the piezoelectric vibrating reed of each package is irradiated with a laser beam from the outside through the cover to partially evaporate the electrode, thereby controlling the frequency in a mass reduction system to control the vibration frequency (refer to ST5 in FIG. 28). Then, necessary inspections are carried out to complete piezoelectric devices.

In the above-described construction of the fifth exemplary embodiment, even when oxygen omission, which causes deterioration in the wettability of the brazing material 33, occurs in melting the brazing material 33 by irradiation of the light beam L3 from the halogen lamps in the cover sealing step, the omission can be compensated for by atmospheric oxygen. Therefore, the fluidity of the brazing material 33 is enhanced in comparison to melting in a nitrogen atmosphere, thereby enhancing the wettability of the brazing material 33 and the bonding strength between the package 36 and the cover 39 and decreasing the melting temperature of the brazing material 33. In the fifth exemplary embodiment, the melting temperature of the brazing material 33 can be decreased to a temperature about 20° C. lower than that in the first exemplary embodiment.

Furthermore, even when the brazing material 33 is melted in the air, harmful gases produced in melting the brazing material 33 can be discharged from the internal spaces S through the through holes 37 in the hole sealing step, thereby obtaining high-performance piezoelectric devices.

In addition, in irradiation of the light beam L3 from the halogen lamps in the air, oxidation of the filaments of the halogen lamps can be prevented because the filaments are contained in the bulbs. Also, the packages 36 are directly heated by the light beam L3 from the halogen lamps, and thus the temperatures of portions other than the packages 36 can be decreased to effectively prevent oxidation in the chamber 12, as compared with the related art method.

In filling the through holes 37 with the sealing material 38 in the hole sealing step, the method of irradiating the sealing material 38a with the light beam L5 from the halogen lamps does not require a special power supply and other apparatuses such as a laser generator, and the like, thereby permitting energy-saving hole sealing at low cost.

Although, in the fifth exemplary embodiment, the hole sealing step is performed immediately after the cover sealing step, the same annealing treatment as related art annealing (refer to ST3 in FIG. 28) may be performed between the cover sealing step and the hole sealing step.

Figure 27:
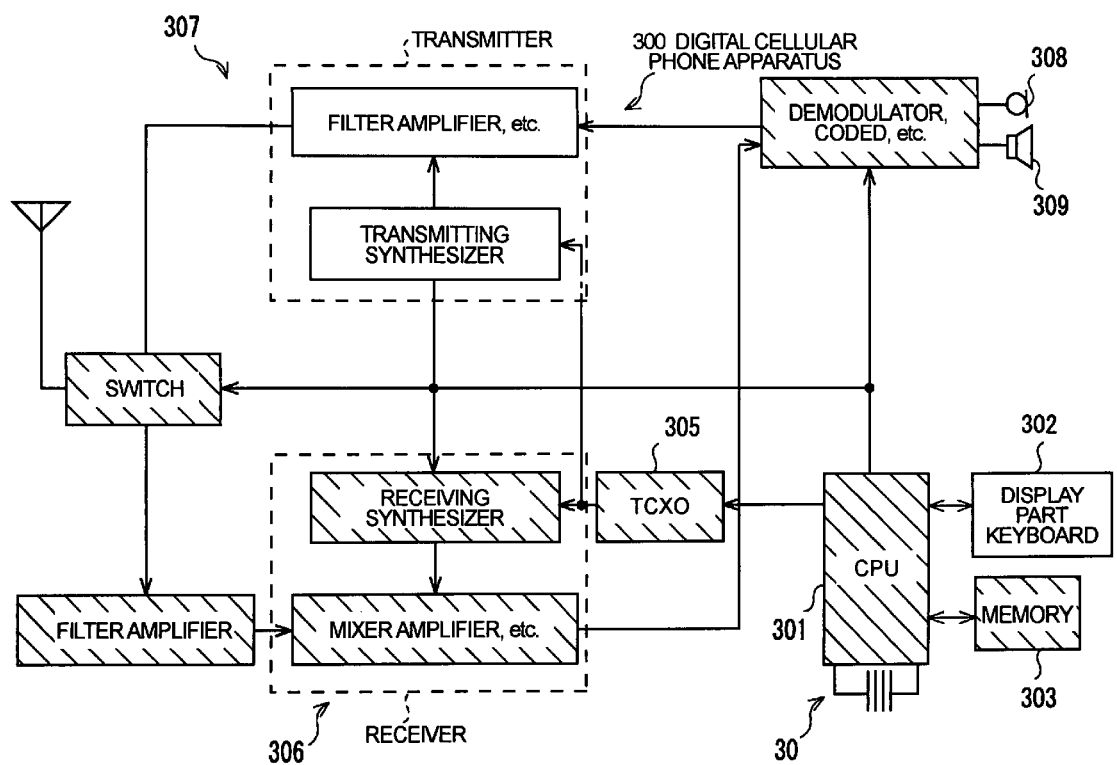
FIG. 27 is a schematic schematically showing a digital cellular phone apparatus as an example of an electronic apparatus using a piezoelectric device according to any one of the first to fifth exemplary embodiments of the present invention.

FIG. 27 is a schematic showing the schematic configuration of a digital cellular phone apparatus as an example of an electronic apparatus using the piezoelectric device according to any of the above-described exemplary embodiments of the present invention.

In FIG. 27, the cellular phone apparatus includes a microphone 308 to receive a voice of an emitter, a speaker 309 to output the received content as a voice, and a controller 301 including an integrated circuit and the like and serving as a control section connected to a modulation-demodulation section for transmitted and received signals.

The controller 301 is adapted to control of the modulation-demodulation section for transmitted and received signals, a LCD serving as an image display section, an information input/output section 302 including an operation key to input information, and an information storage device 303 including RAM, ROM, and the like. Therefore, a piezoelectric device 30 is provided on the controller 301 so that the output frequency of the piezoelectric device 30 is used as a clock signal suitable for control contents by a predetermined frequency divider (not shown in the drawing) contained in the controller 301. The piezoelectric device 30 provided on the controller 301 may be a single piezoelectric device, or an oscillator including the piezoelectric device 30 and the predetermined frequency divider may be used.

The controller 301 is further connected to a temperature compensated crystal oscillator (TCXO) 305 which is connected to a transmission section 307 and a receiving section 306. Therefore, even when a basic clock from the controller 301 varies with a variation in the environmental temperature, the clock is corrected by the temperature compensated crystal oscillator 305, and then transmitted to the transmission section 307 and receiving section 306.

In this way, when the piezoelectric device of any one of the above-described exemplary embodiments is applied to an electronic apparatus, such as the cellular phone apparatus 300 including the control section, a correct clock signal can be generated because of the use of the piezoelectric device precisely sealed with a cover in the manufacturing process.

The present invention is not limited to the above exemplary embodiments. The constructions of the exemplary embodiments can be combined with each other, or any of these constructions can be omitted or combined with another construction not shown in the drawings.

Although, in the above exemplary embodiments, an example of application of a piezoelectric device to a piezoelectric vibrator is described, the present invention is not limited to this example, and can be applied to a piezoelectric oscillator, and other piezoelectric devices each including a piezoelectric vibrating reed contained in a package.

The invention claimed is:

1. A method of sealing packages of piezoelectric devices with covers, each piezoelectric device including a cover fixed to a package in which a piezoelectric vibrating reed is partially supported and fixed, the method comprising:
    arranging the plurality of packages on a holding device such that bottoms of the packages face halogen lamps;
    disposing a mask to cover only the packages and partially expose the holding device; and
    irradiating the bottoms of the plurality of packages with light beams from the halogen lamps to thermally melt a brazing material disposed between the packages and the covers.

2. The method of sealing piezoelectric devices with covers according to claim 1, the cover including a glass material, and the brazing material including low-melting-point glass.

3. The method of sealing piezoelectric devices with covers according to claim 1, further including emitting the light beams in substantially parallel from the halogen lamps of a lamp unit to simultaneously irradiate an entire region including the plurality of packages with the light beams.

4. The method of sealing piezoelectric devices with covers according to claim 1, further including placing the plurality of packages in an air-tight chamber, introducing an inert gas into the chamber after evacuating the chamber, and then irradiating the packages with the light beams from the halogen lamps.

5. The method of sealing piezoelectric devices with covers according to claim 1, the brazing material including a compound of oxygen and metal atoms, and being melted by irradiation of the light beams from the halogen lamps in the air.

6. A method of manufacturing a piezoelectric device including a cover fixed to a package having a through hole to communicate the outside to an internal space, which accommodates a piezoelectric vibrating reed, the method comprising:
    arranging a plurality of packages on a holding device such that bottoms of the packages face halogen lamps;
    disposing a mask to cover only the packages and partially expose the holding device;
    irradiating the bottoms of the packages with light beams from the halogen lamps in the air to thermally melt a brazing material disposed between the packages and the covers, the brazing material including a compound of oxygen and metal atoms, thereby sealing each of the packages with the cover;
    evacuating an internal space of each of the packages through the through hole; and
    subsequently filling the through holes with a sealing material in a vacuum atmosphere to seal the through holes.

7. The method of manufacturing a piezoelectric device according to claim 6, the sealing the through holes includes disposing the sealing material before melting in the through holes, and subsequently thermally melting the sealing material by irradiation of the light beams from the halogen lamps to seal the holes.

8. A method of sealing packages of piezoelectric devices with covers, each piezoelectric device including a cover fixed to a package in which a piezoelectric vibrating reed is partially supported and fixed, the method comprising:
    arranging the plurality of packages on a holding device, with the covers disposed thereon and facing halogen lamps in a state where a brazing material is interposed between the packages and the covers; disposing a mask to cover at least a portion inside a cover sealing region of each of the packages and partially expose the holding device;
    irradiating the covers of the packages with light beams from the halogen lamps to heat the covers; and
    thermally melting the brazing material.

9. The method of sealing piezoelectric devices with covers according to claim 8, each of the covers including a glass material, and low-melting-point glass being used as the brazing material.

10. The method of sealing piezoelectric devices with covers according to claim 8, further including emitting the light beams in substantially parallel from the halogen lamps of a lamp unit to simultaneously irradiate an entire region including the plurality of packages with the light beams.

11. The method of sealing piezoelectric devices with covers according to claim 8, further including: setting the plurality of packages in an air-tight chamber, introducing an inert gas into the chamber after evacuating the chamber, and subsequently irradiating the packages with the light beams from the halogen lamps.

12. The method of sealing piezoelectric devices with covers according to claim 8, the brazing material including a compound of oxygen and metal atoms, and being melted by irradiation of the light beams from the halogen lamps in the air.

13. A method of manufacturing a piezoelectric device including a cover fixed to a package having a through hole to communicate the outside to an internal space, which accommodates a piezoelectric vibrating reed, the method comprising:
    arranging a plurality of packages on a holding device, with the covers disposed thereon and facing halogen lamps in a state where a brazing material is interposed between the packages and the covers, the brazing material including a compound of oxygen and metal atoms; disposing a mask to cover at least a portion inside a cover sealing region of each of the packages and partially expose the holding device;
    heating the covers of the packages by irradiating the covers with light beams from the halogen lamps in the air to thermally melt the brazing material, thereby sealing each of the packages with the cover;
    evacuating the internal space of each of the packages through the through hole; and
    filling the through holes with a sealing material in a vacuum atmosphere to seal the through holes.

14. The method of manufacturing a piezoelectric device according to claim 13, the sealing the through holes including disposing, the sealing material before melting in the through holes, and subsequently thermally melting the sealing material by irradiation of the light beams from the halogen lamps to seal the holes.

* * * * *